(12) United States Patent
Choi et al.

(10) Patent No.: US 10,446,722 B2
(45) Date of Patent: Oct. 15, 2019

(54) WHITE LIGHT EMITTING DEVICE

(71) Applicant: Samsung Electronics Co., Ltd., Suwon-si (KR)

(72) Inventors: Sung Woo Choi, Suwon-si (KR); Cho Hui Kim, Hwaseong-si (KR); Jeong Eun Yun, Hwaseong-si (KR); Chul Soo Yoon, Hwaseong-si (KR)

(73) Assignee: SAMSUNG ELECTRONICS CO., LTD., Samsung-ro, Yeongtong-gu, Suwon-si, Gyeonggi-do (KR)

( * ) Notice: Subject to any disclaimer, the term of this patent is extended or adjusted under 35 U.S.C. 154(b) by 0 days.

(21) Appl. No.: 15/987,195

(22) Filed: May 23, 2018

(65) Prior Publication Data

US 2019/0103523 A1    Apr. 4, 2019

(30) Foreign Application Priority Data

Sep. 29, 2017  (KR) .................. 10-2017-0127987
Dec. 27, 2017  (KR) .................. 10-2017-0180807

(51) Int. Cl.
*H01L 33/50*     (2010.01)
*H01L 25/075*    (2006.01)
(Continued)

(52) U.S. Cl.
CPC ........ *H01L 33/504* (2013.01); *H01L 25/0753* (2013.01); *H01L 33/505* (2013.01); *H01L 33/507* (2013.01); *F21K 9/23* (2016.08); *F21K 9/27* (2016.08); *F21V 29/503* (2015.01); *F21V 29/763* (2015.01); *F21Y 2115/10* (2016.08); *H01L 33/06* (2013.01); *H01L 33/32* (2013.01);
(Continued)

(58) Field of Classification Search
CPC ........ F21K 9/64; H01L 33/502; H01L 25/167
See application file for complete search history.

(56) References Cited

U.S. PATENT DOCUMENTS 6,372,608 B1   4/2002   Shimoda et al.
6,645,830 B2   11/2003  Shimoda et al.
(Continued)

FOREIGN PATENT DOCUMENTS

KR   10-1520377 B1   5/2015
KR   10-1603325 B1   8/2015

*Primary Examiner* — Thomas L Dickey
(74) *Attorney, Agent, or Firm* — Muir Patent Law, PLLC

(57) ABSTRACT

A white light emitting device includes a substrate, a first light emitting diode configured to emit first blue light having a peak intensity at a wavelength within the range of 445 nm to 455 nm, a second light emitting diode configured to emit second blue light having a peak intensity at a wavelength within the range of 465 nm to 495 nm, and a wavelength conversion unit configured to convert portions of the first blue light and the second blue light, and to provide white light formed by a combination of the converted portions of the first blue light and the second blue light with unconverted portions of the first blue light and the second blue light. The wavelength conversion unit includes a first wavelength conversion material configured to emit first light having a peak intensity at a wavelength within the range of 520 nm to 560 nm, and a second wavelength conversion material configured to emit second light having a peak intensity at a wavelength within the range of 600 nm to 645 nm.

20 Claims, 26 Drawing Sheets

(51) Int. Cl.
*H01L 33/54* (2010.01)
*H01L 33/56* (2010.01)
*F21V 29/76* (2015.01)
*F21K 9/23* (2016.01)
*F21K 9/27* (2016.01)
*F21Y 115/10* (2016.01)
*H01L 33/32* (2010.01)
*H01L 33/06* (2010.01)
*F21V 29/503* (2015.01)
*H01L 33/62* (2010.01)

(52) U.S. Cl.
CPC .............. *H01L 33/54* (2013.01); *H01L 33/56* (2013.01); *H01L 33/62* (2013.01)

(56) References Cited

U.S. PATENT DOCUMENTS

| | | | |
|---|---|---|---|
| RE38,466 E | 3/2004 | Inoue et al. | |
| 6,818,465 B2 | 11/2004 | Biwa et al. | |
| 6,818,530 B2 | 11/2004 | Shimoda et al. | |
| 6,858,081 B2 | 2/2005 | Biwa et al. | |
| 6,967,353 B2 | 11/2005 | Suzuki et al. | |
| 7,002,182 B2 | 2/2006 | Okuyama et al. | |
| 7,084,420 B2 | 8/2006 | Kim et al. | |
| 7,087,932 B2 | 8/2006 | Okuyama et al. | |
| 7,154,124 B2 | 12/2006 | Han et al. | |
| 7,208,725 B2 | 4/2007 | Sherrer et al. | |
| 7,288,758 B2 | 10/2007 | Sherrer et al. | |
| 7,319,044 B2 | 6/2008 | Han et al. | |
| 7,501,656 B2 | 3/2009 | Han et al. | |
| 7,709,857 B2 | 5/2010 | Kim et al. | |
| 7,759,140 B2 | 7/2010 | Lee et al. | |
| 7,781,727 B2 | 8/2010 | Sherrer et al. | |
| 7,790,482 B2 | 9/2010 | Han et al. | |
| 7,940,350 B2 | 5/2011 | Jeong | |
| 7,959,312 B2 | 6/2011 | Yoo et al. | |
| 7,964,881 B2 | 6/2011 | Choi et al. | |
| 7,985,976 B2 | 7/2011 | Choi et al. | |
| 7,994,525 B2 | 8/2011 | Lee et al. | |
| 8,008,683 B2 | 8/2011 | Choi et al. | |
| 8,013,352 B2 | 9/2011 | Lee et al. | |
| 8,049,161 B2 | 11/2011 | Sherrer et al. | |
| 8,129,711 B2 | 3/2012 | Kang et al. | |
| 8,179,938 B2 | 5/2012 | Kim | |
| 8,263,987 B2 | 9/2012 | Choi et al. | |
| 8,324,646 B2 | 12/2012 | Lee et al. | |
| 8,399,944 B2 | 3/2013 | Kwak et al. | |
| 8,432,511 B2 | 4/2013 | Jeong | |
| 8,459,832 B2 | 6/2013 | Kim | |
| 8,502,242 B2 | 8/2013 | Kim | |
| 8,536,604 B2 | 9/2013 | Kwak et al. | |
| 8,735,931 B2 | 5/2014 | Han et al. | |
| 8,766,295 B2 | 7/2014 | Kim | |
| 9,596,730 B1 | 3/2017 | Ciccarelli et al. | |
| 9,693,408 B2 | 6/2017 | Lu et al. | |
| 2003/0227249 A1* | 12/2003 | Mueller | H01L 33/501 313/491 |
| 2010/0060195 A1 | 3/2010 | Tsuboi et al. | |
| 2012/0087124 A1* | 4/2012 | Ravillisetty | C09K 11/0883 362/235 |
| 2016/0149094 A1* | 5/2016 | Onuma | H01L 25/0753 257/89 |
| 2017/0130909 A1 | 5/2017 | Yeon et al. | |
| 2017/0151359 A1 | 6/2017 | Clynne et al. | |

* cited by examiner

WHITE LIGHT EMITTING DEVICE

CROSS-REFERENCE TO RELATED APPLICATION(S)

This application claims priority under 35 U.S.C. § 119 to Korean Patent Application No. 10-2017-0127987, filed on Sep. 29, 2017, and Korean Patent Application No. 10-2017-0180807, filed on Dec. 27, 2017, in the Korean Intellectual Property Office, the disclosures of which are incorporated herein by reference in their entireties.

BACKGROUND

1. Field

The present inventive concept relates to a white light emitting device and a lighting device using the same.

2. Description of Related Art

In general, wavelength conversion materials such as phosphors have been used as materials for converting light having a certain wavelength, emitted by various types of light sources, into light having desired wavelengths. In particular, such wavelength conversion materials have been widely applied to white light emitting devices for various types of lighting devices, as well as in displays such as liquid crystal display (LCD) backlights, through being combined with semiconductor light emitting diodes (LEDs) having improved optical efficiency.

Generally, white light emitting devices have been fabricated by using a plurality of wavelength conversion materials (for example, green and red, or blue, yellow, and red) such as phosphors in ultraviolet or blue LED chips or packages.

In recent years, in white lighting fields, there has been a need for human-friendly LED lighting devices taking human biorhythms, retinal damage, and the like into account, and white light emitting devices that can be used therein.

SUMMARY

An aspect of the present inventive concept may provide a white light emitting device that may improve optical properties as a general lighting device, while reducing blue light hazard (BLH), in order to provide human-friendly lighting, and a lighting device using the white light emitting device.

According to an aspect of the present inventive concept, a white light emitting device may include: a substrate; a first light emitting diode disposed on the substrate, the first light emitting diode configured to emit first blue light having a peak intensity at a wavelength within the range of 445 nm to 455 nm; a second light emitting diode disposed on the substrate, the second light emitting diode configured to emit second blue light having a peak intensity at a wavelength within the range of 465 nm to 495 nm; and a wavelength conversion unit applied to the first light emitting diode and the second light emitting diode, the wavelength conversion unit configured to convert portions of the first blue light and the second blue light and to provide a white light formed by the combination of the converted portions of the first blue light and the second blue light with unconverted portions of the first blue light and the second blue light, in which the wavelength conversion unit may include a first wavelength conversion material configured to emit first light having a peak intensity at a wavelength within the range of 520 nm to 560 nm and a second wavelength conversion material configured to emit second light having a peak intensity at a wavelength within the range of 600 nm to 645 nm, and, in a spectrum of the white light, a peak intensity of the unconverted portion of the second blue light may be equal to 50% or more of a peak intensity of the unconverted portion of the first blue light, and the maximum intensity in a wavelength band of 520 nm to 560 nm may be between 70% and 160% of the peak intensity of the unconverted portion of the second blue light.

According to an aspect of the present inventive concept, a white light emitting device may include: a first light emitting diode configured to emit first blue light having a peak intensity at a wavelength within the range of 445 nm to 455 nm; a second light emitting diode configured to emit second blue light having a peak intensity at a wavelength within the range of 465 nm to 490 nm; a first wavelength conversion material configured to convert at least portions of the first blue light and the second blue light to emit first light having a peak intensity at a wavelength within the range of 520 nm to 560 nm; and a second wavelength conversion material configured to convert at least portions of the first blue light and the second blue light to emit second light having a peak intensity at a wavelength within the range of 600 nm to 645 nm, the second wavelength conversion material having at least one red phosphor selected from among $(Sr,Ca)AlSiN_3$:Eu, $CaAlSiN_3$:Eu, and any combination thereof, in which a combination of an unconverted portion of the first blue light, an unconverted portion of the second blue light, the first light, and the second light may produce a white light, and, in a spectrum of the white light, peak intensities of the unconverted portion of the first blue light and the unconverted portion of the second blue light may range from 50% to 110% and from 53% to 110% of a peak intensity of the second light respectively, the sum of the peak intensities of the unconverted portions of the first blue light and the second blue light may range from 140% to 180% of the peak intensity of the second light, and the maximum intensity in a wavelength range of 530 nm to 550 nm may range from 70% to 90% of the peak intensity of the second light.

According to an aspect of the present inventive concept, a white light emitting device may include: a first light emitting diode configured to emit first blue light having a peak intensity at a wavelength within the range of 445 nm to 455 nm; a second light emitting diode configured to emit second blue light having a peak intensity at a wavelength within the range of 465 nm to 495 nm; a first wavelength conversion material configured to convert at least portions of the first blue light and the second blue light to emit first light having a peak intensity at a wavelength within the range of 520 nm to 560 nm; and a second wavelength conversion material configured to convert at least portions of the first blue light and the second blue light to emit second light having a peak intensity at a wavelength within the range of 600 nm to 645 nm, the second wavelength conversion material including a $K_xSiF_y$:$Mn^{4+}$ ($2 \leq x \leq 3$, $4 \leq y \leq 7$) phosphor, in which a combination of an unconverted portion of the first blue light, an unconverted portion of the second blue light, the first light, and the second light may produce a white light, and, in a spectrum of the white light, peak intensities of the unconverted portion of the first blue light and the unconverted portion of the second blue light may range from 20% to 50% of a peak intensity of the second light, the sum of the peak intensities of the unconverted portions of the first blue light and the second blue light may range from 58% to 67% of the peak intensity of the second light, and intensities of light having wavelengths of 530 nm and 550 nm may range from 30% to 40% of the peak intensity of the second light.

BRIEF DESCRIPTION OF DRAWINGS

The above, and other aspects, features, and advantages of the present disclosure will be more clearly understood from the following detailed description when taken in conjunction with the accompanying drawings, in which.

DETAILED DESCRIPTION

Hereinafter, example embodiments of the present inventive concept will be described in more detail with reference to the attached drawings.

Figure 1:
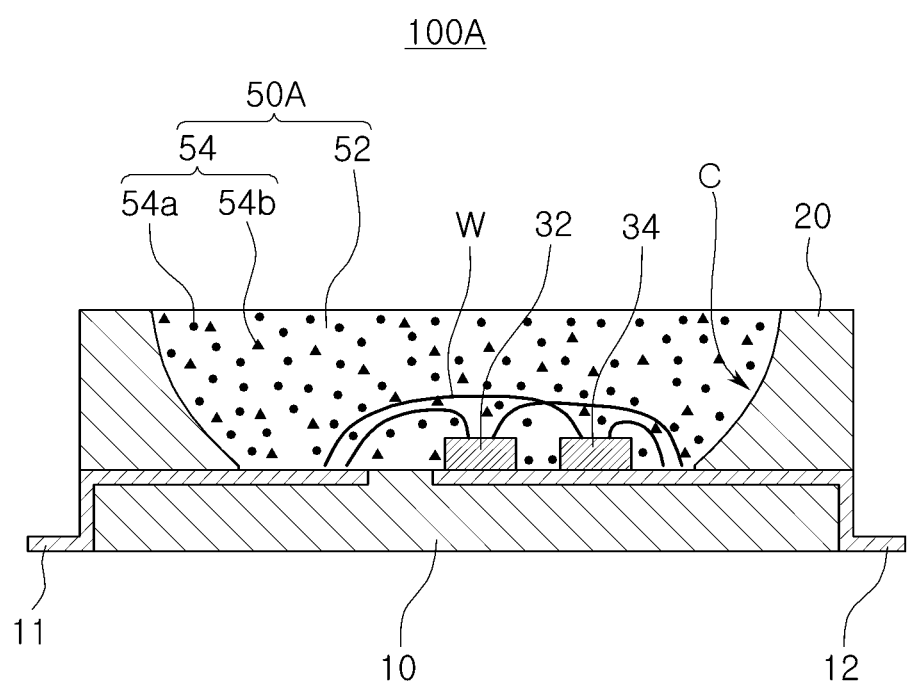
FIG. 1 is a schematic cross-sectional view of a white light emitting device, according to an example embodiment.

FIG. 1 is a schematic cross-sectional view of a white light emitting device 100A, according to an example embodiment.

Referring to FIG. 1, the white light emitting device 100A, according to the example embodiment, may include a package substrate 10 having a cavity C and first and second electrode structures 11 and 12, first and second semiconductor light emitting diodes (LEDs) 32 and 34 disposed in the cavity C of the package substrate 10, and a wavelength conversion unit 50A disposed in the cavity C to cover the first and second semiconductor LEDs 32 and 34. LEDs 32 and 34 may be the only LEDs in the white light emitting device. The first and second electrode structures 11 and 12 may be wiring provided on and/or through the package substrate 10.

The first and second semiconductor LEDs 32 and 34 may be connected to the first and second electrode structures 11 and 12 in the cavity C, respectively. For example, the first and second electrode structures 11 and 12 may extend from outside the cavity C into the cavity C, and the first and second LEDs 32 and 34 may be electrically connected to the first and second electrode structures 11 and 12 inside the cavity C. In the example embodiment, the first and second semiconductor LEDs 32 and 34 may be connected to the first and second electrode structures 11 and 12 by a wire W. However, example embodiments of the present inventive concept are not limited thereto, and the first and second semiconductor LEDs 32 and 34 may be connected to the first and second electrode structures 11 and 12 in a flip-chip manner. For example, the first and second LEDs 32 and 34 may be embodied in respective semiconductor chips. For example, the first and second LEDs 32 and 34 may be connected to the first and second electrode structures 11 and 12 in a serial manner or in a parallel manner. The first and second LEDs 32 and 34 may receive the same operating voltage and/or same operating power from a voltage source to which the electrode structures 11 and 12 are connected. Thus, the ratio of operating power of the LEDs may be fixed (e.g., the operating power of LED 32 to LED 34 may be fixed for a range of operating light intensities output by the white light emitting device 100A). Alternatively, the electrode structures 11 and 12 may be provided to independently supply voltage and power to the LEDs 32 and 34 so that they may be independently controlled. The first semiconductor LED 32 may emit first blue light having a peak intensity at a wavelength within the range of 445 nm to 455 nm, and the second semiconductor LED 34 may emit second blue light having a peak intensity at a wavelength within the range of 465 nm to 495 nm.

When the second semiconductor LED 34 emitting light having a long wavelength has relatively low efficiency, the second semiconductor LED 34 having a larger area than the area of the first semiconductor LED 32 may be used. For example, a plan view area of the second semiconductor LED 34 may be greater than a plan view area of the first semiconductor LED 32. For example, one that has a lower intensity efficiency per area may have a larger plan view area than the other between the first and second semiconductor LEDs 32 and 34.

The wavelength conversion unit 50A may be formed of a light transmitting resin 52 containing wavelength conversion materials 54. For example, the light transmitting resin 52 may include epoxy, silicone, modified silicone, a urethane resin, an oxetane resin, acrylic, polycarbonate, polyimide, or any combination thereof. The wavelength conversion materials 54 may absorb and convert light generated by LEDs 32 and 34. The wavelength conversion materials 54 may be the only structure in the white light emitting device 100A that generates light having a wavelength greater than blue light (e.g., green, yellow, orange, and/or red light).

In some example embodiments, the wavelength conversion materials 54 may surround surfaces of the first and second semiconductor LEDs 32 and 34 without being dispersed into the light transmitting resin 52.

The wavelength conversion materials 54 may include a first wavelength conversion material 54a emitting first light having a peak intensity at a wavelength within the range of 520 nm to 560 nm, and a second wavelength conversion material 54b emitting second light having a peak intensity at a wavelength within the range of 600 nm to 645 nm. For example, the first wavelength conversion material 54a may include at least one phosphor selected from among Ga—$Y_3Al_5O_{12}$ (hereinafter also referred to as YAG), $Al_5Lu_3O_{12}$, $Y_3Al_5O_{12} \cdot Al_5Lu_3O_{12}$, and any combination thereof. The second wavelength conversion material 54b may include at least one phosphor selected from among (Sr,Ca)$AlSiN_3$:Eu, $CaAlSiN_3$:Eu, $K_xSiF_y$:$Mn^{4+}$ (2≤x≤3, 4≤y≤7) (hereinafter also referred to as KSF), and any combination thereof. The first or second wavelength conversion material 54a or 54b may include two types of phosphors (please see the following example embodiment 1). The first or second wavelength conversion material 54a or 54b may have excitation efficiency, obtained by the first blue light, higher than that obtained by the second blue light. For example, dominant excitation light from the first and second wavelength conversion material 54a and 54b may be the first blue light.

Blue light hazard (BLH) values may be reduced by employing the second blue light relatively softer than the first blue light, together with the first blue light. Further, the white light emitting device 100A may reduce BLH values by adjusting a ratio of second blue light intensity to first blue light intensity, and may increase color rendering index (CRI) values by a combination of the first and second wavelength conversion materials 54a and 54b. For example, in the present disclosure, blue light hazard (BLH) values or BLH indices may be defined as intensities of light having wavelengths between 400 nm and 450 nm, and may have a unit $\mu W/cm^2$.

In a spectrum of the white light, according to the example embodiment, a peak intensity of the second blue light may be equal to 50% or more of that of the first blue light. The ratio of second blue light intensity to first blue light intensity may be determined to be 70% or more in order to obtain a BLH reduction effect. In certain embodiments, the peak intensity of the second blue light may be higher than that of the first blue light. A ratio of intensity and wavelength of the second blue light may be adjusted to be within a range in which the CRI value of the light emitting device may be maintained to be 90 or more. Further, in terms of CRI, the maximum intensity in a wavelength band of 520 nm to 560 nm may be equal to 70% to 160% or more of the peak intensity of the second blue light.

A conventional method using a near-ultraviolet LED to reduce BLH values may provide white light as warm white light having a low correlated color temperature (CCT) (for example, 2,000 K or less) and increasing secretion of melatonin, thus limiting the use of the white light to night lighting. However, the white light emitting device 100A according to the example embodiment, may reduce BLH values while using blue light and obtaining a high CCT of 3,000 K or more.

As described above, the first blue light having a peak intensity at a wavelength within the range of 445 nm to 455 nm, the second blue light having a peak intensity at a wavelength within the range of 465 nm to 495 nm, the first light (cyan, green or yellow) having a peak intensity at a wavelength within the range of 520 nm to 560 nm, and the second light having a peak intensity at a wavelength within the range of 600 nm to 645 nm, may be mixed to provide white light for human-friendly lighting.

Figure 2:
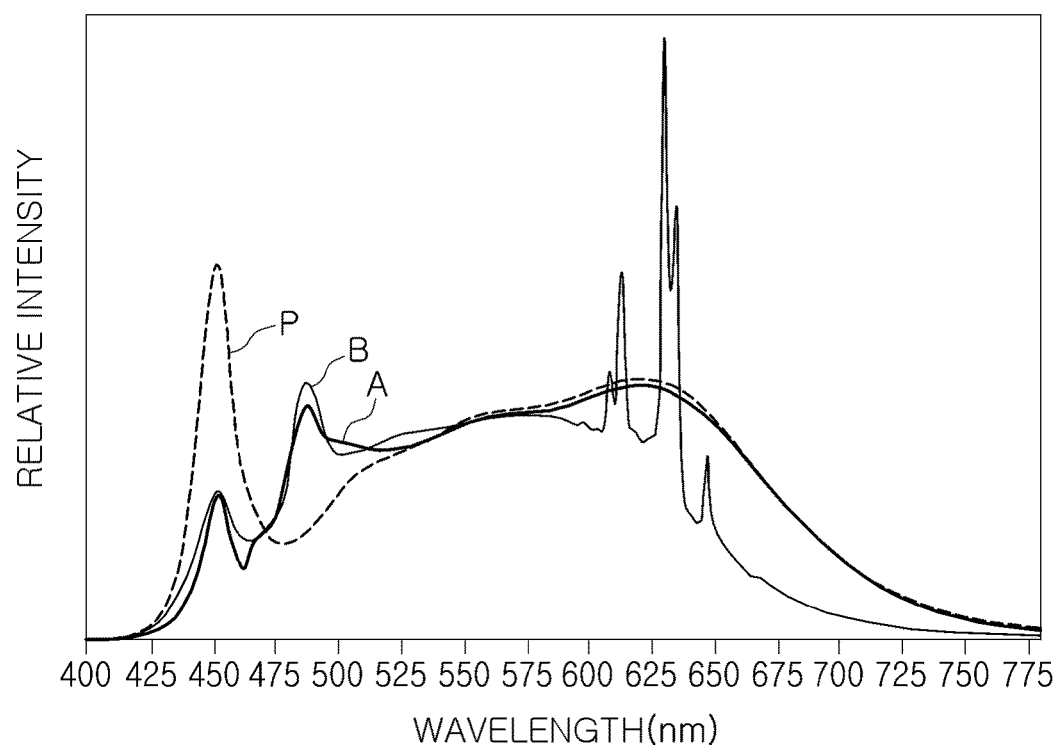
FIG. 2 is a graph illustrating light spectrums of beams of white light emitted by various white light emitting devices.

FIG. 2 is a graph illustrating light spectrums A, B, and P of beams of white light emitted by white light emitting devices, according to example embodiments 1 and 2 of Table 1 below, and by a white light emitting device, according to Comparative Example of Table 1 below. It will be appreciated that when referring to light being emitted by an element herein, the light being referenced is at the point of (although it may be evaluated at a different location). Thus, light emitted by the white light emitting devices described herein refers to light exiting the white light emitting devices to an external source. Unless context indicates otherwise (e.g., discussion of an element or portion of certain light), reference to light (e.g., emitted light) refers to all of the elements of such light (e.g., referring to light emitted by the white light emitting device refers to all colors of light constituting the white light, unless discussion indicates otherwise).

Referring to FIG. 2, the white light emitting device of the Comparative Example is a lighting product having a CRI 94. The Comparative Example may provide the white light spectrum P. The white light emitting device, according to the Comparative Example, may include a blue LED having a peak intensity at a wavelength of 450 nm, and the blue LED may include three types of phosphors (e.g., phosphors having respective peak conversion wavelengths: 530 nm, 620 nm, and 640 nm), thus having a high CRI.

The white light emitting devices of the example embodiments 1 and 2 used a first blue LED having a wavelength of 450 nm which is similar to the blue LED of the Comparative Example (Spectrum P), and also used a second blue LED having a peak intensity at a wavelength of 485 nm. The white light emitting device, according to the example embodiment 1, used a combination of three types of phosphors (having respective peak conversion wavelengths: 530 nm, 620 nm, and 640 nm) which is similar to those used in the Comparative Example, such that Spectrum A of white light could be obtained. The white light emitting device, according to the example embodiment 2, used a combination of a YAG phosphor (emitting light of 540 nm to 550 nm) and a KSF phosphor (emitting light of 630 nm), such that Spectrum B of white light could be obtained.

Referring to FIG. 2, Spectrum P of the Comparative Example, may be similar to Spectrum A of the example embodiment 1, except for a portion of a blue wavelength band. For example, it can be seen that Spectrum P of the Comparative Example has single peak intensity in the blue wavelength band, while Spectrum A has a relatively less peak intensity of the first blue light and a peak intensity of the second blue light higher than that of the first blue light.

Further, it can be seen that a peak intensity of Spectrum B of the example embodiment 2 is different from that of Spectrum A of the example embodiment 1 in a red wavelength band, while Spectrum B has a peak intensity of second blue light higher than that of first blue light, similarly to Spectrum A of the example embodiment 1, and the maximum intensity in a wavelength band of 520 nm to 560 nm is about 80% of the peak intensity of the second blue light.

The spectrums of beams of white light, illustrated in FIG. 2, indicate optical properties and human-centric indices shown in Table 1 below. As the optical properties, CCT, CRI, and luminous efficacy of radiation (LER) values were measured, and, as the human-centric indices, BLH and equivalent melanopic lux (EML) values were measured, at 100 lux. Unless otherwise stated, the same indices in the following example embodiments are values measured at 100 lux. For example, the optical properties and the human-centric indices are measured with respect to a white light of 100 lux, or may be converted to be proportional values to 100 lux of white light.

TABLE 1

| Classification | Optical Property | | | Human-Centric Index | |
|---|---|---|---|---|---|
| | CCT (K) | CRI | LER (lm/W) | EML (lux) | BLH ($\mu W/cm^2$) |
| Example 1 (A) | 4000 | 90 | 302 | 75.2 | 3.18 |
| Example 2 (B) | 4000 | 92 | 338 | 79.0 | 3.60 |
| Comparative Example (P) | 3998 | 94 | 286 | 74.2 | 5.42 |

As shown in Table 1 above, in the case of Spectrums A and B of beams of white light, according to example embodiments 1 and 2, it could be seen that the CCT, CRI, and LER values were maintained at high levels, and the human-centric indices, in particular, the BLH values, were significantly decreased to about 58% and 65%, as compared to the Comparative Example.

The white light emitting devices, according to example embodiments 1 and 2, may provide human-friendly white lighting having a significantly reduced level of BLH, while maintaining optical properties such as CRI or the like. The beams of white light, according to the example embodiments 1 and 2, may have different values of CCTs. For example, the optical properties and/or the human-centric indices of the example embodiments 1 and 2 may vary while the BLH level maintains a lower level than those of existing light emitting devices.

Figure 3A:
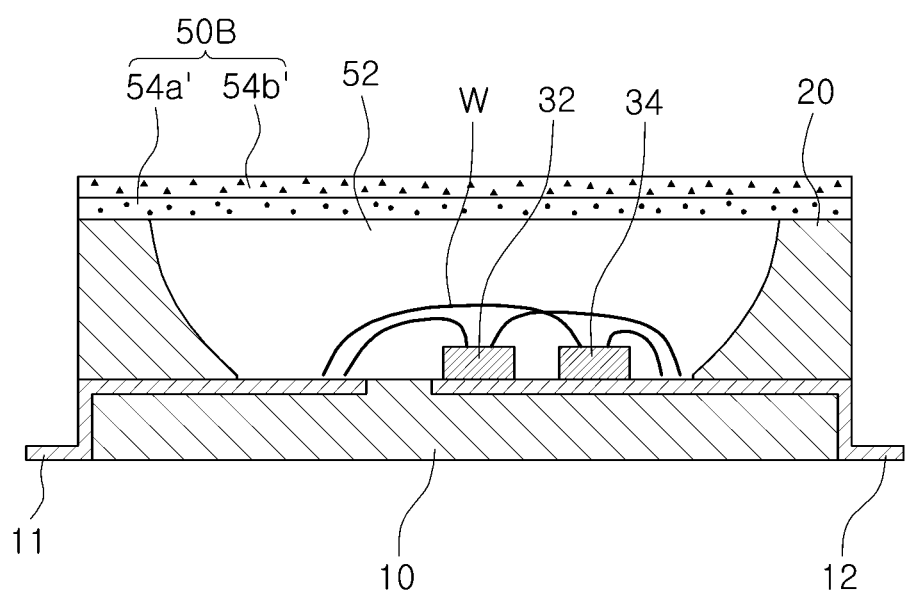
FIGS. 3A and 3B are schematic cross-sectional views illustrating white light emitting devices, according to various example embodiments.
Figure 3B:
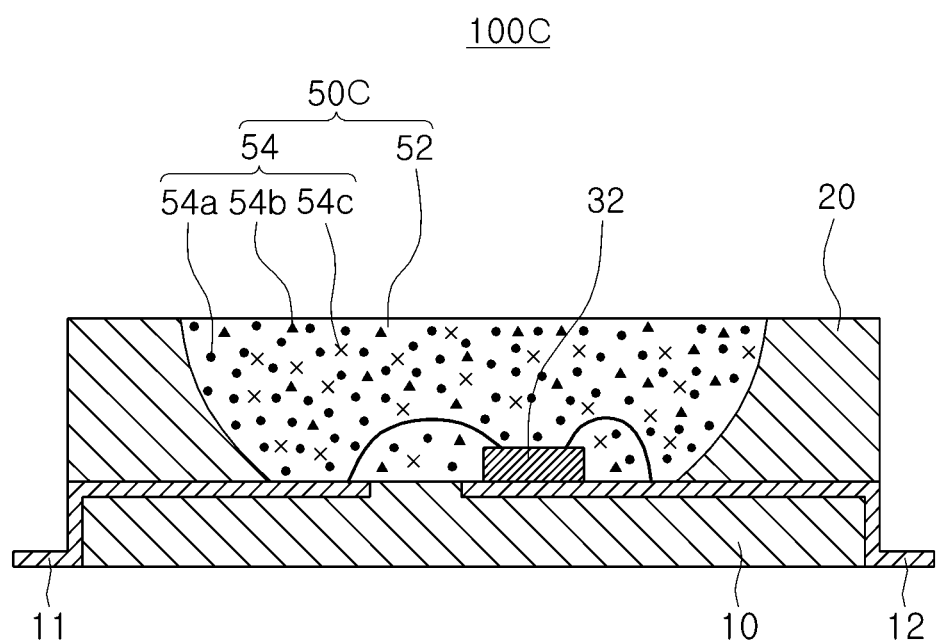

The white light emitting devices, according to the example embodiments 1 and 2, may be provided as various types of packages illustrated in FIGS. 3A and 3B.

Referring to FIG. 3A, a white light emitting device 100B, according to an example embodiment, may be similar to the white light emitting device 100A illustrated in FIG. 1, except for a structure of a wavelength conversion unit 50B. Unless specifically stated otherwise, elements of the present embodiment may be the same as or similar to the elements of the embodiments illustrated in FIG. 1, and may refer to the description of the constituent elements of the white light emitting device 100A above.

Similar to the previous example embodiment, a first semiconductor LED 32 may emit first blue light having a peak intensity at a wavelength within the range of 445 nm to 455 nm, and a second semiconductor LED 34 may emit second blue light having a peak intensity at a wavelength within the range of 465 nm to 495 nm.

The wavelength conversion unit 50B, employed in the example embodiment, may have a film shape. A wavelength conversion material may be produced as additional films, for example, first and second wavelength conversion films 54a' and 54b', which may be stacked on a light emitting surface of the white light emitting device 100B. For example, each of the first and second wavelength conversion films 54a' and 54b' may be formed of a ceramic film including a phosphor, or may also be formed by mixing a transparent resin using a binder. The first wavelength conversion film 54a' may be formed of a first wavelength conversion material emitting first light having a peak intensity at a wavelength within the range of 520 nm to 560 nm, and the second wavelength conversion film 54b' may be formed of a second wavelength conversion material emitting second light having a peak intensity at a wavelength within the range of 600 nm to 645 nm.

The present example embodiment includes the first and second wavelength conversion films 54a' and 54b' including respective wavelength conversion materials. However, certain example embodiments may include a single wavelength conversion film having a plurality of wavelength conversion materials mixed therein instead of the first and second wavelength conversion films 54a' and 54b'. In another example embodiment, one of the first and second wavelength conversion films 54a' and 54b' may be disposed in film form, and the wavelength conversion material of the other of the first and second wavelength conversion films 54a' and 54b' may be mixed with the light transmitting resin 52, as similarly illustrated in FIG. 1. For example, the first and second wavelength conversion films 54a' and 54b' may be formed by spin coating processes or inkjet printing processes. In certain embodiments, the first and second wavelength conversion films 54a' and 54b' may be attached on the resin 52 by film attaching processes.

In the above-mentioned example embodiment, the second blue light may be emitted by an additional semiconductor LED, e.g., similarly to the second semiconductor LED 34 of the previous embodiments. However, a light source for the second blue light may be formed of a wavelength conversion material using the first semiconductor LED 32 as an excitation light source emitting the first blue light having a short wavelength. A white light emitting device 100C, according to an example embodiment, is illustrated in FIG. 3B.

Referring to FIG. 3B, the white light emitting device 100C, according to the example embodiment, may include a package substrate 10 having a cavity C and first and second electrode structures 11 and 12, a blue LED 32 disposed in the cavity C of the package substrate 10, and a wavelength conversion unit 50C disposed in the cavity C to cover the blue LED 32.

The blue LED 32 may emit first blue light having a peak intensity at a wavelength within the range of 445 nm to 455 nm. In the example embodiment, an LED, e.g., the second LED 34 of the previous embodiments, may be replaced with a third wavelength conversion material 54c as a light source for second blue light. The third wavelength conversion material 54c may be excited by the first blue light to emit the second blue light having a peak intensity at a wavelength within the range of 465 nm to 495 nm.

As described above, a wavelength conversion material 54 employed in the example embodiment may include the third wavelength conversion material 54c, together with first and second wavelength conversion materials 54a and 54b, and may provide the second blue light having a peak intensity at a wavelength within the range of 465 nm to 495 nm. A resin 52 and the first and second wavelength conversion materials 54a and 54b may be the same as or similar to the ones described with reference to FIG. 1.

BLH values may be reduced by employing the second blue light obtained by using the third wavelength conversion material 54c, together with the first blue light. Further, BLH values may be reduced and high CRI values may be ensured by adjusting a ratio of second blue light intensity to first blue light intensity and maintaining intensity of first light at a constant level. For example, the intensity of the first light may be maintained to be lower than a predetermined level through the corresponding wavelength range from 445 nm to 455 nm to reduce BLH values of the light emitting devices. For example, the intensity ratio of the first blue light to a peak value of the intensity of the second blue light may be lower than 0.7 throughout the first blue light range between 445 nm and 455 nm.

In certain embodiments, a light source for the first blue light and a light source for the second blue light may be provided as a single LED. A white light emitting device 100D, according to an example embodiment, is illustrated in FIG. 4A.

Figure 4A:
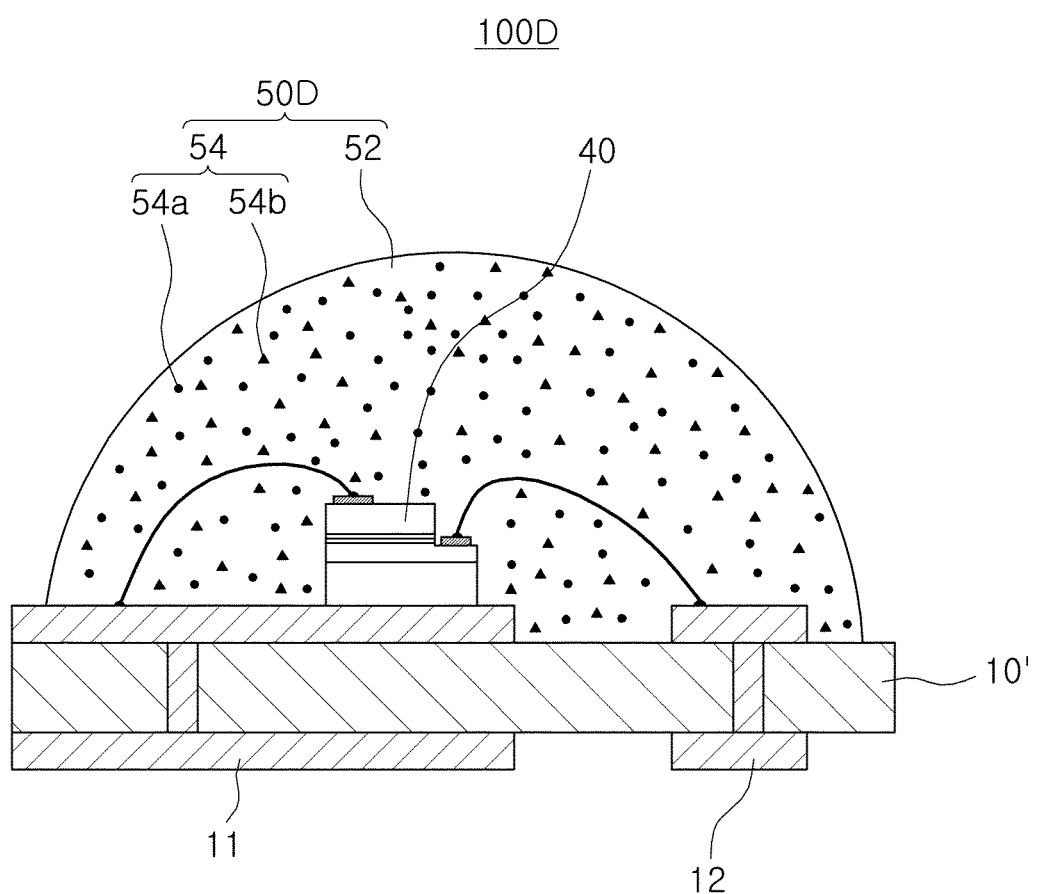
FIG. 4A is a schematic cross-sectional view illustrating a white light emitting device, according to an example embodiment.

Referring to FIG. 4A, the white light emitting device 100D, according to the example embodiment, may be understood as being similar to the white light emitting device 100A illustrated in FIG. 1, except that the white light emitting device 100D has a single LED having two active layers, and that a structure of the package substrate 10' is different from that of the package substrate 10 of the white light emitting device 100A. Unless specifically stated otherwise, constituent elements of the present example embodiment may be the same as or similar to those of the constituent elements of the white light emitting device 100A illustrated in FIG. 1.

Figure 4B:
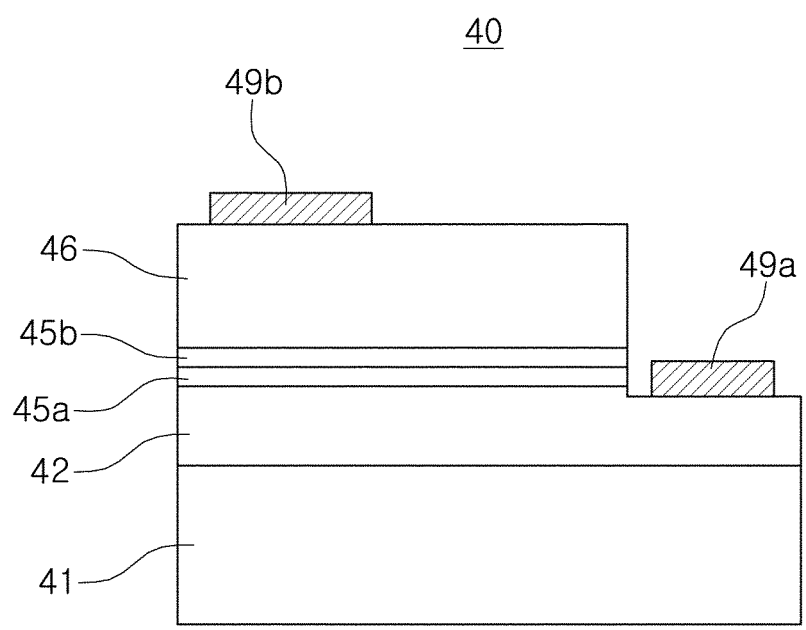
FIG. 4B is a schematic cross-sectional view illustrating a light emitting diode chip employed in the white light emitting device of FIG. 4A.

The white light emitting device 100D, according to the example embodiment, may include a plate-type package substrate 10' having no cavity, unlike in the previous example embodiments, and a single semiconductor LED 40 mounted on the package substrate 10' may be surrounded by a resin 52 having a convex shape. As illustrated in FIG. 4B, the semiconductor LED 40 may have a first active layer 45a emitting first blue light having a peak intensity at a wavelength within the range of 445 nm to 455 nm, and a second active layer 45b emitting second blue light having a peak intensity at a wavelength within the range of 465 nm to 495 nm.

The semiconductor LED 40 may be a chip including a substrate 41, a first conductivity-type semiconductor layer 42, the first active layer 45a, the second active layer 45b, and a second conductivity-type semiconductor layer 46 disposed sequentially on the substrate 41. The first conductivity-type semiconductor layer 42 may be a nitride semiconductor layer having a composition of n-type $In_xAl_yGa_{1-x-y}N$ ($0 \leq x<1$, $0 \leq y<1$, $0 \leq x+y<1$), and n-type impurities of the first conductivity-type semiconductor layer 42 may be silicon (Si). The second conductivity-type semiconductor layer 46 may be a nitride semiconductor layer having a composition of p-type $In_xAl_yGa_{1-x-y}N$ ($0 \leq x<1$, $0 \leq y<1$, $0 \leq x+y<1$), and p-type impurities of the second conductivity-type semiconductor layer 46 may be magnesium (Mg). Each of the first and second active layers 45a and 45b may have a multiple quantum well (MQW) structure in which quantum well layers and quantum barrier layers are alternately stacked on top of each other. For example, the quantum well layers may include a composition of $In_xGa_{1-x}N$ ($0<x \leq 1$), and the quantum barrier layers may include GaN. The content of indium (In) contained in each of the first and second active layers 45a and 45b may be adjusted, such that the first and second active layers 45a and 45b may emit beams of blue light having different wavelengths. The structure of each of the first and second active layers 45a and 45b is not limited to a MQW structure. For example, each of the first and second active layers 45a and 45b may have a single quantum well (SQW) structure. In the example embodiment, first and second electrodes 49a and 49b may be disposed on a mesa-etched region of the first conductivity-type semiconductor layer 44 and on the second conductivity-type semiconductor layer 46, respectively, so as to be located on the same surface (for example, a first surface). For example, the first and second electrodes 49a and 49b may faces the same direction. For example, the first and second electrodes 49a and 49b may be formed on top surfaces of the first and second conductivity-type semiconductor layers 44 and 46 respectively. However, structures of the first and second electrodes 49a and 49b may be changed to various different structures.

As in the example embodiment illustrated in FIG. 1, the first and second wavelength conversion materials 54a and 54b may be dispersed into the resin 52 to form a wavelength conversion unit 50D. In some example embodiments, the first and second wavelength conversion materials 54a and 54b may be applied onto surfaces of the semiconductor LED 40, instead of being dispersed into the resin 52. The first wavelength conversion material 54a may emit first light having a peak intensity at a wavelength within the range of 520 nm to 560 nm, and the second wavelength conversion material 54b may emit second light having a peak intensity at a wavelength within the range of 600 nm to 645 nm.

BLH values may be reduced by employing the second blue light relatively softer than the first blue light, together with the first blue light. Further, BLH values may be reduced by adjusting a ratio of second blue light intensity to first blue light intensity, and CRI values may be increased by a combination of the first and second wavelength conversion materials 54a and 54b.

As described above, in a spectrum of white light, a peak intensity of the second blue light may be equal to 50% or more of that of the first blue light. Further, the peak intensity of the second blue light may be determined to be higher than that of the first blue light. A ratio of intensity and wavelength of the second blue light may be adjusted to be within a range in which CRI values may be maintained to be 90 or more. Further, in view of CRI, the maximum intensity in a wavelength band of 520 nm to 560 nm may be equal to 70% to 160% or more of the peak intensity of the second blue light.

Hereinafter, the conditions of a wavelength and relative intensity of the relatively softer second blue light having a longer wavelength than the first blue light and the conditions of a spectrum (a wavelength and relative intensity of light converted by the first and second wavelength conversion materials 54a and 54b) in a different wavelength band will be described to ensure desired white light properties.

(I) Wavelength Condition of Second Blue Light (A)

Spectrums of beams of white light having a CCT of about 4,000 K and a CRI of 90 or more were designed by simulation, using a first LED emitting first blue light (B) having a peak intensity at a wavelength of 447 nm, a YAG-based phosphor converting the first blue light (B) into first light (G) having a peak intensity at a wavelength of 545 nm, and a red phosphor converting the first blue light (B) into second light (R) having a peak intensity at a wavelength within the range of 625 nm to 640 nm. Spectrums of beams of white light were obtained with respect to different wavelengths of second blue light (SB) as an additional component which is relatively softer than the first blue light B.

For example, the wavelength of the second blue light (SB) was changed to 460 nm, 470 nm, 475 nm, 480 nm, 485 nm, and 490 nm to obtain respective Spectrums A1 to A6 of beams of white light, and Spectrum P1 of white light was obtained without using a second LED for comparison with Spectrums A1 to A6.

Figure 5:
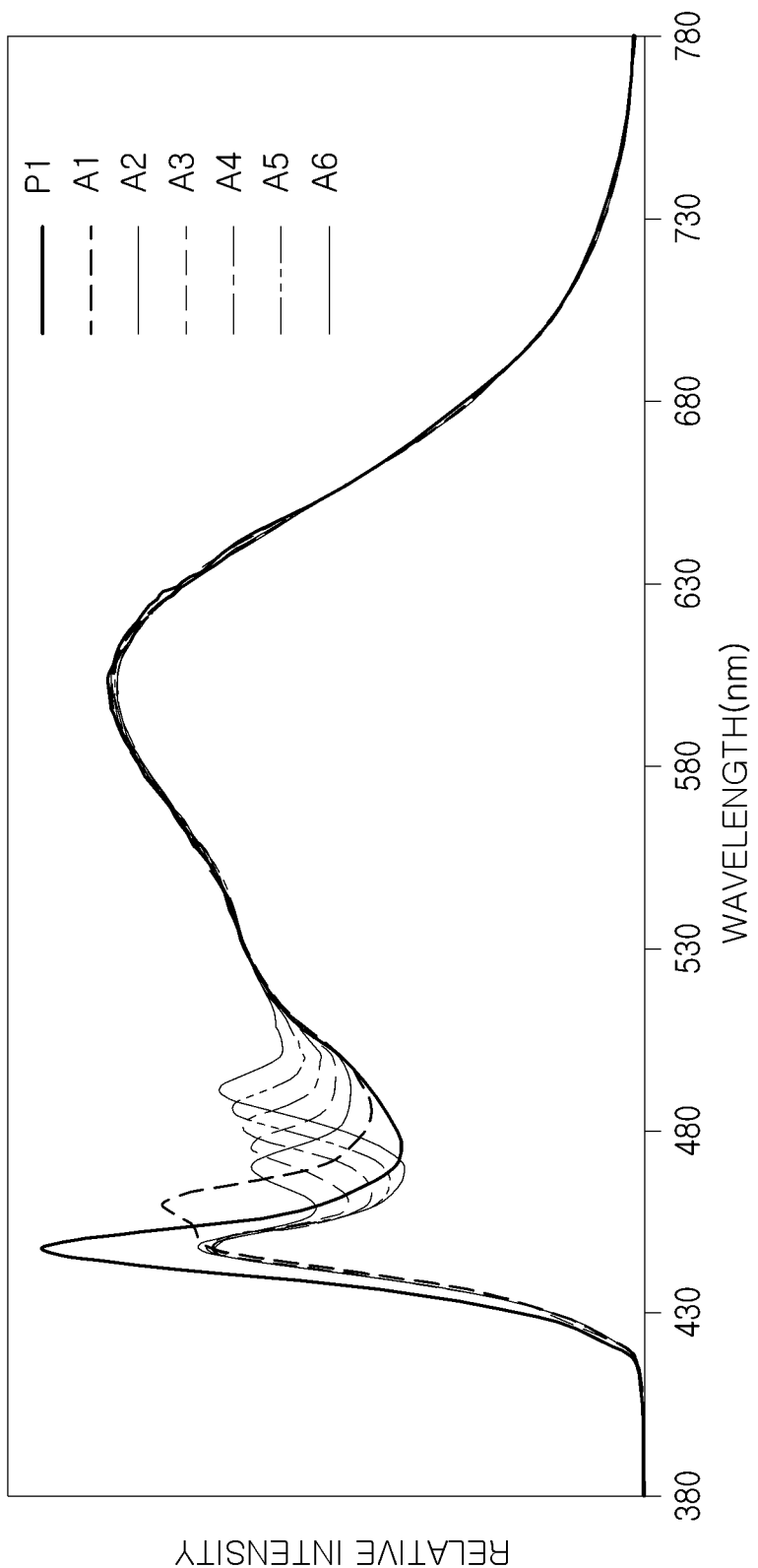
FIG. 5 is a graph illustrating light spectrums of beams of white light (changes in wavelength of second blue light) emitted by a white light emitting device, according to example embodiments.

FIG. 5 is a graph illustrating Spectrums A1 to A6 and P1 of beams of white light, according to the example embodiments described above and the Comparative Example. Intensities of Spectrums A1 to A6 and P1 of beams of white light according to the example embodiments and the Comparative Example were measured, and the results are shown in Table 2 below. The intensities, shown in Table 2, are relative intensities measured, taking the case that a peak intensity of white light in a red light wavelength band is 1 as an example. Since there was no peak intensity in a green light wavelength band (e.g., between 520 nm and 560 nm) in Spectrums A1 to A6 according to the example embodiments, intensities of Spectrums A1 to A6 at 530 nm (G1) and 550 nm (G2) are displayed in Table 2 instead.

TABLE 2

| Classification | B | SB | B + SB | SB/B | G1 | G2 | G2/SB |
|---|---|---|---|---|---|---|---|
| P1 | 1.12 | — | — | — | 0.747 | 0.804 | 1 |
| A1 | 0.786 | 0.902 | 1.688 | 114.8% | 0.747 | 0.804 | 89.1% |
| A2 | 0.829 | 0.736 | 1.565 | 88.8% | 0.748 | 0.804 | 109.2% |
| A3 | 0.819 | 0.737 | 1.556 | 90.0% | 0.748 | 0.804 | 109.1% |
| A4 | 0.815 | 0.754 | 1.569 | 92.5% | 0.749 | 0.805 | 106.8% |
| A5 | 0.813 | 0.776 | 1.589 | 95.4% | 0.751 | 0.805 | 103.7% |
| A6 | 0.813 | 0.803 | 1.616 | 98.8% | 0.754 | 0.805 | 100.2% |

In addition, Table 2 shows a ratio (SB/B) of second blue light (SB) intensity to first blue light (B) intensity, together with the sum (S+SB) of the first blue light (B) intensity and the second blue light (SB) intensity. In particular, these values may be understood as factors having an influence on human-centric indices, such as BLH. Further, a ratio (G2/SB) of intensity of each of Spectrums A1 to A6 in the green light wavelength band (G2) to the second blue light (SB) intensity was calculated. This value may be understood as a factor having an influence on, for example, the requirement of CRI.

TABLE 3

| | Optical Property | | | | Human-Centric Index | |
|---|---|---|---|---|---|---|
| Classification | CCT (K) | CRI | LER (lm/W) | Rf | CAF | EML (lux) | BLH ($\mu W/cm^2$) |
| P1 | 4069 | 90 | 308 | 88 | 0.65 | 74.5 | 5.32 |
| A1 | 4085 | 90 | 309 | 87 | 0.65 | 77.0 | 5.01 |
| A2 | 4070 | 90 | 310 | 88 | 0.65 | 77.2 | 4.91 |
| A3 | 4062 | 90 | 310 | 88 | 0.64 | 77.5 | 4.81 |
| A4 | 4056 | 90 | 311 | 88 | 0.64 | 77.7 | 4.70 |
| A5 | 4053 | 90 | 312 | 88 | 0.63 | 77.7 | 4.60 |
| A6 | 4054 | 90 | 313 | 88 | 0.62 | 77.6 | 4.50 |

It can be seen that the human-centric indices were improved overall in Table 3. For example, as compared to the Comparative Example not using the second blue light but using the first blue light only, the CRI values of the example embodiments were maintained to be 90 or more and the BLH values were reduced to about 90% or less, and in particular, in some example embodiments (Spectrums A4 to A6), the BLH values were reduced to 69% to 80% of the BLH value of the Comparative Example.

(II) Relative Intensity Condition of Second Blue Light (A)

The example embodiments were conducted while changing relative intensity conditions of the second blue light with respect to the intensity of the first blue light. For example, in Spectrums A1, A5, and A6, Spectrums of beams of white light were produced by changing a ratio of the first blue light intensity to the second blue light intensity. Hereinafter, the ratio changes of the second blue light intensity to the first blue light intensity and their characteristics will be described, according to different wavelengths of the second blue light.

(II-1) Second Blue Light (460 nm) (A1)

Figure 6A:
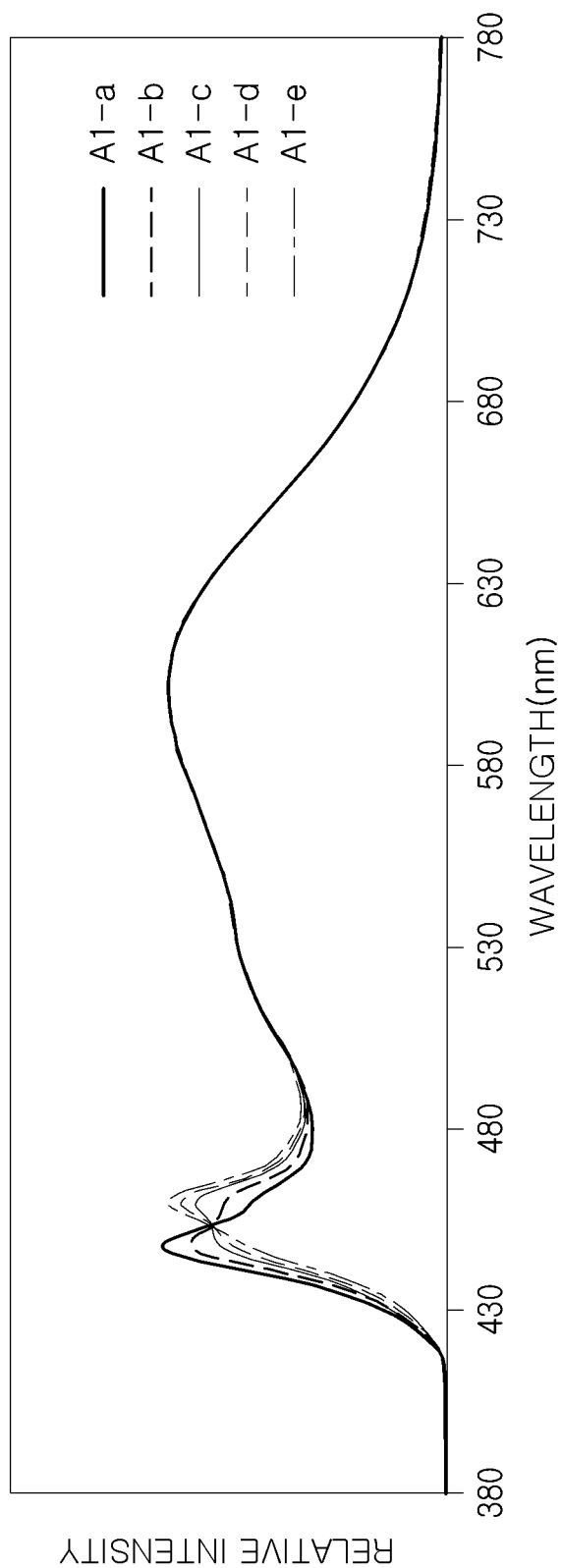
FIGS. 6A through 6C are graphs illustrating light spectrums of beams of white light (changes in intensity ratio according to wavelength bands of second blue light) emitted by a white light emitting device, according to example embodiments.

Spectrums of beams of white light were produced by changing relative intensity of the second blue light having a peak intensity at a wavelength of 460 nm with respect to the peak intensity of the first blue light, and the results are illustrated in FIG. 6A. Intensities of the spectrums, according to the example embodiments, were measured, and the results are shown in Table 4 below. The description manner of Table 4 is the same as that in Table 2 above.

TABLE 4

| Classification | B | SB | B + SB | SB/B | G1 | G2 | G2/SB |
|---|---|---|---|---|---|---|---|
| A1-a | 1.008 | 0.699 | 1.707 | 69.3% | 0.746 | 0.804 | 115.0% |
| A1-b | 0.897 | 0.8 | 1.697 | 89.2% | 0.746 | 0.804 | 100.5% |
| A1-c | 0.786 | 0.902 | 1.688 | 114.8% | 0.747 | 0.804 | 89.1% |
| A1-d | 0.73 | 0.952 | 1.682 | 130.4% | 0.747 | 0.804 | 84.5% |
| A1-e | 0.674 | 1.003 | 1.677 | 148.8% | 0.747 | 0.804 | 80.2% |

The optical properties and human-centric indices of the respective spectrums of beams of white light were measured, and the results are shown in Table 5 below.

TABLE 5

| | Optical Property | | | | Human-Centric Index | |
|---|---|---|---|---|---|---|
| Classification | CCT (K) | CRI | LER (lm/W) | Rf | CAF | EML (lux) | BLH ($\mu W/cm^2$) |
| P1 | 4069 | 90 | 308 | 88 | 0.65 | 74.6 | 5.32 |
| A1-a | 4074 | 90.1 | 308 | 88 | 0.65 | 75.4 | 5.21 |
| A1-b | 4080 | 90.2 | 309 | 88 | 0.65 | 76.2 | 5.11 |
| A1-c | 4085 | 90.1 | 309 | 86 | 0.65 | 77.0 | 5.01 |
| A1-d | 4088 | 90.0 | 309 | 86 | 0.65 | 77.4 | 4.96 |
| A1-e | 4090 | 89.8 | 310 | 86 | 0.65 | 77.8 | 4.90 |

As shown in Table 5 above, it can be seen that the human-centric indices are improved overall. For example, as compared to the Comparative Example (Spectrum P1) only using the first blue light without using the second blue light, the CRI values were maintained to be about 90 or more, and the BLH values were reduced. However, in the wavelength conditions, it could be seen that when a relative intensity ratio of the second blue light to the first light was greater than a certain value, for example, 148.8% (in Spectrum A1-e), the CRI was reduced to 90 or less.

(II-2) Second Blue Light (485 nm) (A5)

Figure 6B:
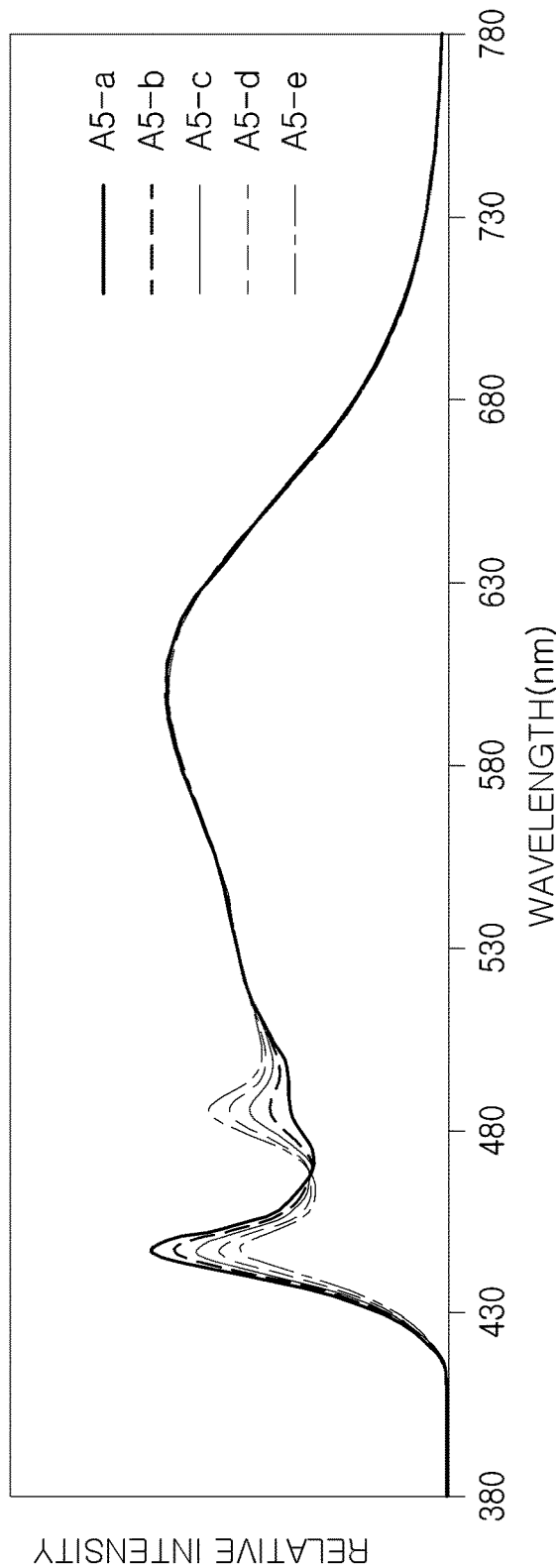

Spectrums of beams of white light were produced by changing relative intensity of the second blue light having a peak intensity at a wavelength of 485 nm with respect to the peak intensity of the first blue light, and the results are illustrated in FIG. 6B. Intensities of the spectrums, according to the present example embodiments, were measured, and the results are shown in Table 6 below. The description manner of Table 6 is the same as that in Table 2 above.

TABLE 6

| Classification | B | SB | B + SB | SB/B | G1 | G2 | G2/SB |
|---|---|---|---|---|---|---|---|
| A5-a | 1.043 | 0.552 | 1.595 | 52.9% | 0.748 | 0.804 | 145.7% |
| A5-b | 0.967 | 0.627 | 1.594 | 64.8% | 0.749 | 0.805 | 128.4% |
| A5-c | 0.89 | 0.702 | 1.592 | 78.9% | 0.75 | 0.805 | 114.7% |
| A5-d | 0.813 | 0.776 | 1.589 | 95.4% | 0.751 | 0.805 | 103.7% |
| A5-e | 0.737 | 0.851 | 1.588 | 115.5% | 0.752 | 0.805 | 94.6% |

The optical properties and human-centric indices of the respective spectrums of beams of white light were measured, and the results are shown in Table 7 below.

TABLE 7

| | Optical Property | | | | Human-Centric Index | |
|---|---|---|---|---|---|---|
| Classification | CCT (K) | CRI | LER (lm/W) | Rf | CAF | EML (lux) | BLH ($\mu W/cm^2$) |
| P1 | 4069 | 90 | 308 | 88 | 0.65 | 74.6 | 5.32 |
| A5-a | 4066 | 90.2 | 309 | 89 | 0.64 | 75.3 | 5.14 |
| A5-b | 4061 | 90.4 | 310 | 89 | 0.64 | 76.1 | 4.96 |
| A5-c | 4057 | 90.3 | 311 | 89 | 0.63 | 76.8 | 4.78 |
| A5-d | 4053 | 90.1 | 312 | 88 | 0.63 | 77.5 | 4.60 |
| A5-e | 4050 | 89.7 | 313 | 87 | 0.63 | 78.2 | 4.42 |

As shown in Table 7 above, it can be seen that the human-centric indices are improved overall. For example, as compared to the Comparative Example (Spectrum P1) only using the first blue light without using the second blue light, the CRI values were maintained to be 90 or more, and the BLH values were significantly reduced (up to 86% in the case of Spectrum A5-d). However, in the present wavelength conditions, it could be seen that when a relative intensity ratio of the second blue light to the first blue light was greater than certain value, for example, 115.5% (in Spectrum A5-e), the CRI was reduced to 90 or less.

(II-3) Second Blue Light (495 nm) (A7)

Figure 6C:
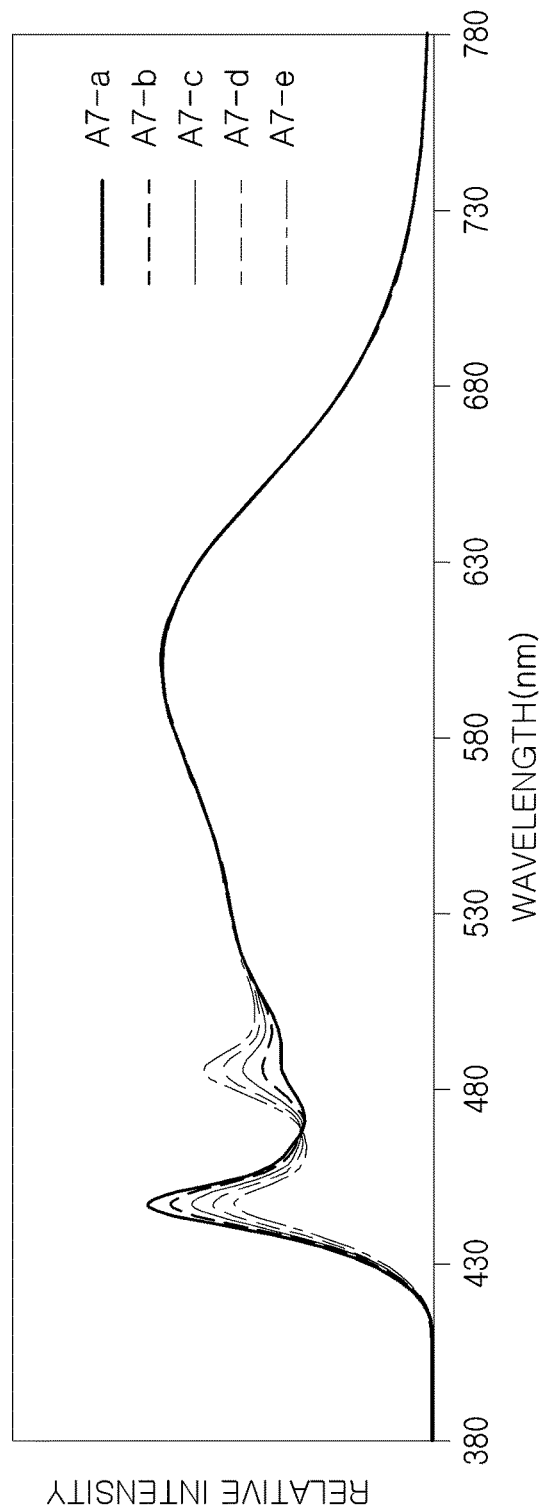

Spectrums of beams of white light were produced by changing relative intensity of the second blue light having a peak intensity at a wavelength of 495 nm with respect to the peak intensity of the first blue light, and the results are illustrated in FIG. 6C. Intensities of the spectrums, according to the example embodiments, were measured, and the results are shown in Table 8 below. The description manner of Table 8 is the same as that in Table 2 above.

TABLE 8

| Classification | B | SB | B + SB | SB/B | G1 | G2 | G2/SB |
|---|---|---|---|---|---|---|---|
| A7-a | 1.043 | 0.604 | 1.647 | 57.9% | 0.75 | 0.805 | 133.3% |
| A7-b | 0.966 | 0.68 | 1.646 | 70.4% | 0.752 | 0.805 | 118.4% |
| A7-c | 0.889 | 0.756 | 1.645 | 85.0% | 0.755 | 0.805 | 106.5% |
| A7-d | 0.812 | 0.832 | 1.644 | 102.5% | 0.758 | 0.806 | 96.9% |
| A7-e | 0.659 | 0.984 | 1.643 | 149.3% | 0.764 | 0.806 | 81.9% |

The optical properties and human-centric indices of the respective spectrums of beams of white light were measured, and the results are shown in Table 9 below.

TABLE 9

| | Optical Property | | | | Human-Centric Index | |
|---|---|---|---|---|---|---|
| Classification | CCT (K) | CRI | LER (lm/W) | Rf | CAF | EML (lux) | BLH ($\mu W/cm^2$) |
| P1 | 4069 | 90 | 308 | 88 | 0.65 | 74.6 | 5.32 |
| A7-a | 4067 | 90.3 | 310 | 89 | 0.64 | 75.3 | 5.99 |

TABLE 9-continued

| | Optical Property | | | | Human-Centric Index | |
|---|---|---|---|---|---|---|
| Classification | CCT (K) | CRI | LER (lm/W) | Rf | CAF | EML (lux) | BLH ($\mu W/cm^2$) |
| A7-b | 4065 | 90.5 | 311 | 90 | 0.63 | 76.0 | 5.71 |
| A7-c | 4063 | 90.5 | 313 | 90 | 0.62 | 76.7 | 5.85 |
| A7-d | 4061 | 90.3 | 315 | 89 | 0.62 | 77.4 | 5.78 |
| A7-e | 4058 | 89.5 | 318 | 86 | 0.60 | 79.0 | 5.99 |

As shown in Table 9 above, when a wavelength of the second blue light is 495 nm, the EML values of the human-centric indices are slightly improved, and the BLH values thereof are increased overall. In at least the above-mentioned wavelength conditions (for example, the conditions that a red light wavelength band has a peak intensity of white light), a BLH improvement effect may be obtained when the wavelength of the second blue light is lower than 495 nm.

(III) Wavelength Condition of Second Blue Light (B)

The present example embodiments were conducted similarly to the previous example embodiments, and a KSF phosphor was used as a red phosphor. For example, spectrums of beams of white light having a CCT of about 4,000 K and a CRI of 90 or more were designed by simulation, using a first LED emitting first blue light (B) having a peak intensity at a wavelength of 447 nm, a YAG-based phosphor converting the first blue light (B) into first light (G) having a peak intensity at a wavelength of 545 nm, and a KSF red phosphor converting the first blue light (B) into second light (R). The spectrums of beams of white light were obtained with respect to different wavelengths of second blue light (SB) as an additional component which is relatively softer than the first blue light.

The wavelength of the second blue light (SB) was changed to 460 nm, 470 nm, 475 nm, 480 nm, 485 nm, 490 nm and 495 nm to obtain respective Spectrums B1 to B7 of beams of white light, and Spectrum P2 of white light obtained without using a second LED, for comparison with Spectrums B1 to B7.

Figure 7:
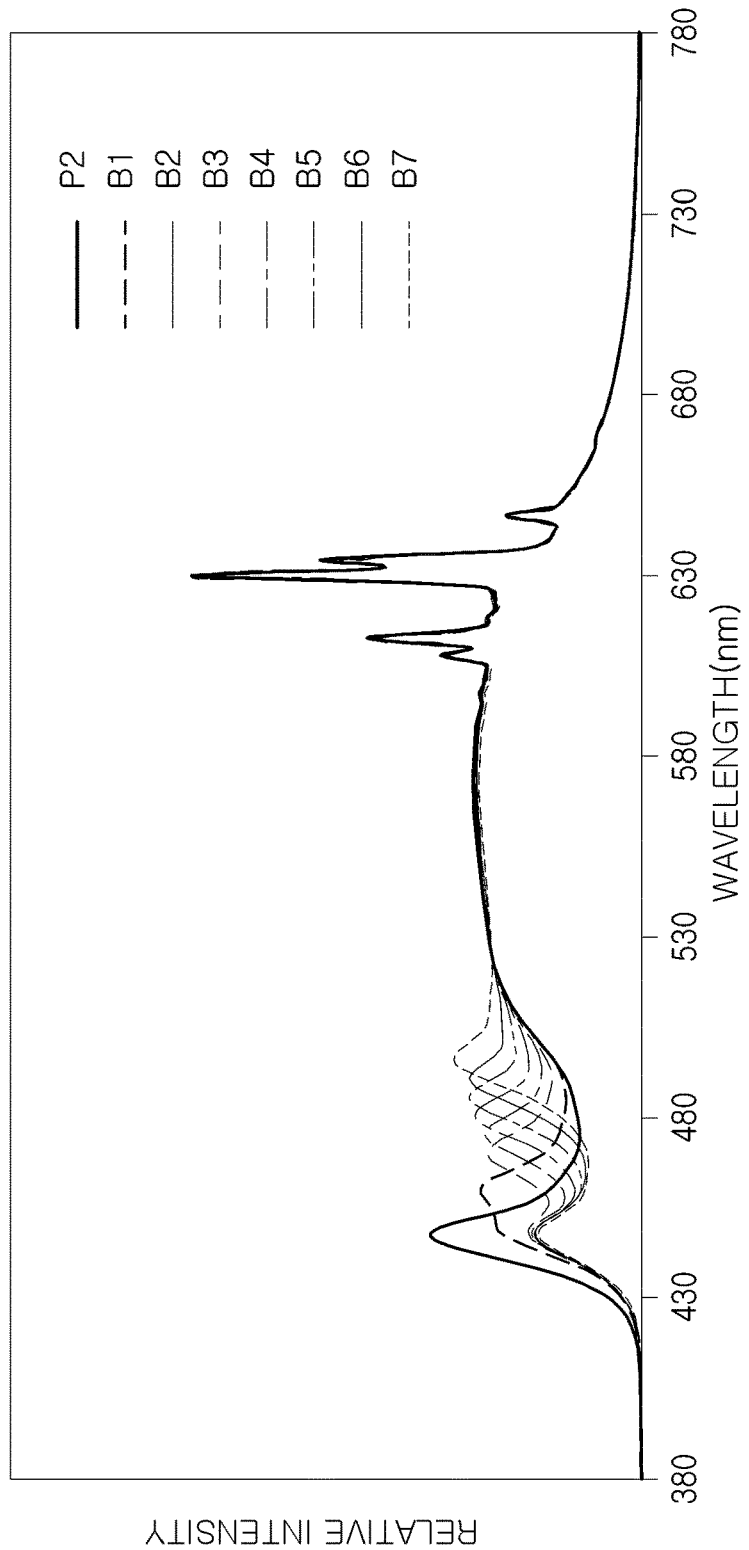
FIG. 7 is a graph illustrating light spectrums of beams of white light (changes in intensity ratio according to wavelength bands of second blue light) emitted by a white light emitting device, according to example embodiments.

FIG. 7 is a graph illustrating Spectrums B1 to B7 and P2 of beams of white light, according to the example embodiments and the Comparative Example. Some intensities of Spectrums B1 to B7 and P2 of beams of white light, according to the example embodiments and the Comparative Example, were measured, and the results are shown in Table 10 below. The intensities, shown in Table 10, are relative intensities that are converted from measured intensities with respect to standard intensities, each of which corresponds to a peak intensity in a red light wavelength band that is set as standard intensity 1. In addition, Table 10 shows a ratio (SB/B) of second blue light (SB) intensity to first blue light (B) intensity, together with the sum (S+SB) of the first blue light (B) intensity and the second blue light (SB) intensity.

TABLE 10

| HCL-3 | B | SB | B + SB | SB/B | G1 | G2 | G2/SB |
|---|---|---|---|---|---|---|---|
| P2 | 0.467 | — | | | 0.342 | 0.361 | |
| B1 | 0.299 | 0.36 | 0.659 | 120.4% | 0.342 | 0.361 | 100.3% |
| B2 | 0.248 | 0.345 | 0.593 | 139.1% | 0.342 | 0.361 | 104.6% |
| B3 | 0.24 | 0.351 | 0.591 | 146.3% | 0.343 | 0.361 | 102.8% |
| B4 | 0.237 | 0.376 | 0.613 | 158.6% | 0.344 | 0.361 | 96.0% |
| B5 | 0.236 | 0.39 | 0.626 | 165.3% | 0.345 | 0.361 | 92.6% |
| B6 | 0.236 | 0.391 | 0.627 | 165.7% | 0.347 | 0.362 | 92.6% |
| B7 | 0.235 | 0.43 | 0.665 | 183.0% | 0.351 | 0.362 | 84.2% |

The optical properties and human-centric indices of the respective spectrums of beams of white light were measured, and the results are shown in Table 11 below.

TABLE 11

| Classification | Optical Property | | | Human-Centric Index | | |
|---|---|---|---|---|---|---|
| | CCT (K) | CRI | LER (lm/W) | Rf | CAF | EML (lux) | BLH (μW/cm²) |
| P2 | 3966 | 90 | 334 | 88 | 0.59 | 69.4 | 4.69 |
| B1 | 4016 | 91 | 335 | 86 | 0.59 | 72.3 | 4.33 |
| B2 | 4001 | 91 | 337 | 85 | 0.59 | 74.1 | 3.97 |
| B3 | 3990 | 91 | 338 | 84 | 0.58 | 74.7 | 3.79 |
| B4 | 4001 | 91 | 339 | 83 | 0.58 | 75.9 | 3.66 |
| B5 | 3997 | 90 | 341 | 84 | 0.57 | 76.0 | 3.47 |
| B6 | 3981 | 90 | 344 | 84 | 0.55 | 74.8 | 3.26 |
| B7 | 4013 | 90 | 346 | 84 | 0.54 | 74.9 | 3.13 |

As shown in Table 11 above, it can be seen that the human-centric indices are improved overall. For example, as compared to the Comparative Example not using a second blue light but using the first blue light only, it could be seen that the CRI values were maintained to be 90 or more and the BLH values were reduced to 93% or less. In some example embodiments (e.g., Spectrums B4 to B7), the BLH values were reduced to 66% to 80% of the BLH of the Comparative Example. Further, unlike in the previous example embodiments, even when a peak intensity of the second blue light was at a wavelength of 495 nm, a BLH value was markedly improved while maintaining the CRI values 90 or greater.

(IV) Relative Intensity Condition of Second Blue Light (B)

The present example embodiments were conducted to obtain relative intensity conditions of the second blue light with respect to the intensity of the first blue light. Spectrums of beams of white light were produced by changing a ratio of second blue light intensity to first blue light intensity with respect to some example embodiments corresponding to Spectrums B1, B5, and B7. Hereinafter, characteristics of light according to the ratio of the second blue light intensity to the first blue light intensity will be described with respect to different wavelengths of the second blue light.

(IV-1) Second Blue Light (460 nm) (B1)

Figure 8A:
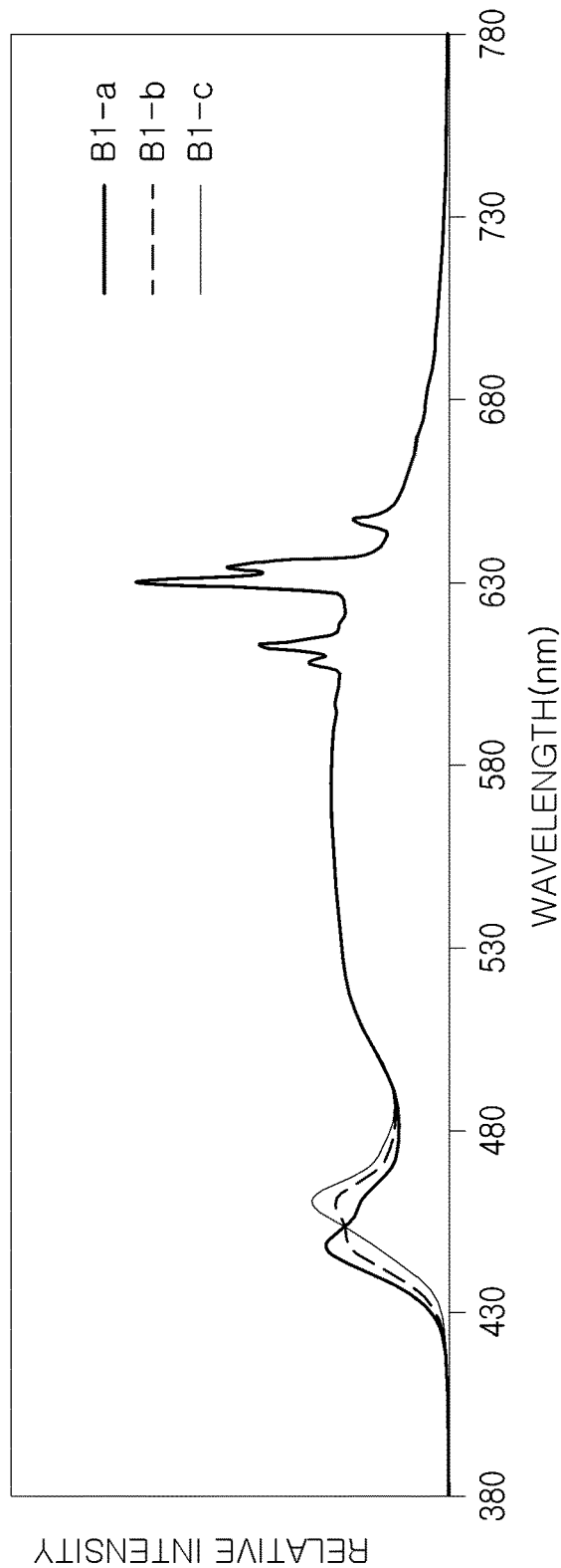
FIGS. 8A through 8C are graphs illustrating light spectrums of beams of white light (changes in intensity ratio according to wavelength bands of second blue light) emitted by a white light emitting device, according to example embodiments.

Spectrums of beams of white light were produced by changing relative intensity of the second blue light having a peak intensity at a wavelength of 460 nm with respect to the intensity of the first blue light, and the results are illustrated in FIG. 8A. Intensities of the spectrums, according to the example embodiments, were measured, and the results are shown in Table 12 below. The description manner of Table 12 is the same as that in Table 2 above.

TABLE 12

| Classification | B | SB | B + SB | SB/B | G1 | G2 | G2/SB |
|---|---|---|---|---|---|---|---|
| B1-a | 0.383 | 0.283 | 0.666 | 73.9% | 0.342 | 0.361 | 127.6% |
| B1-b | 0.299 | 0.36 | 0.659 | 120.4% | 0.342 | 0.361 | 100.3% |
| B1-c | 0.215 | 0.436 | 0.651 | 202.8% | 0.342 | 0.361 | 82.8% |

The optical properties and human-centric indices of the respective spectrums of beams of white light were measured, and the results are shown in Table 13 below.

TABLE 13

| Classification | Optical Property | | | Human-Centric Index | | |
|---|---|---|---|---|---|---|
| | CCT (K) | CRI | LER (lm/W) | Rf | CAF | EML (lux) | BLH (μW/cm²) |
| P2 | 3996 | 90.1 | 334 | 88 | 0.59 | 69.7 | 4.70 |
| B1-a | 4006 | 90.9 | 334 | 89 | 0.59 | 71.1 | 4.51 |
| B1-b | 4016 | 91.3 | 335 | 88 | 0.59 | 72.6 | 4.33 |
| B1-c | 4025 | 91.2 | 336 | 85 | 0.60 | 74.0 | 4.15 |

As shown in Table 13 above, it can be seen that the human-centric indices are improved overall. For example, as compared to the Comparative Example (Spectrum P2) only using the first blue light without using the second blue light, the CRI values were maintained to be 90 or more, and the BLH values were reduced.

(IV-2) Second Blue Light (485 nm) (B5)

Figure 8B:
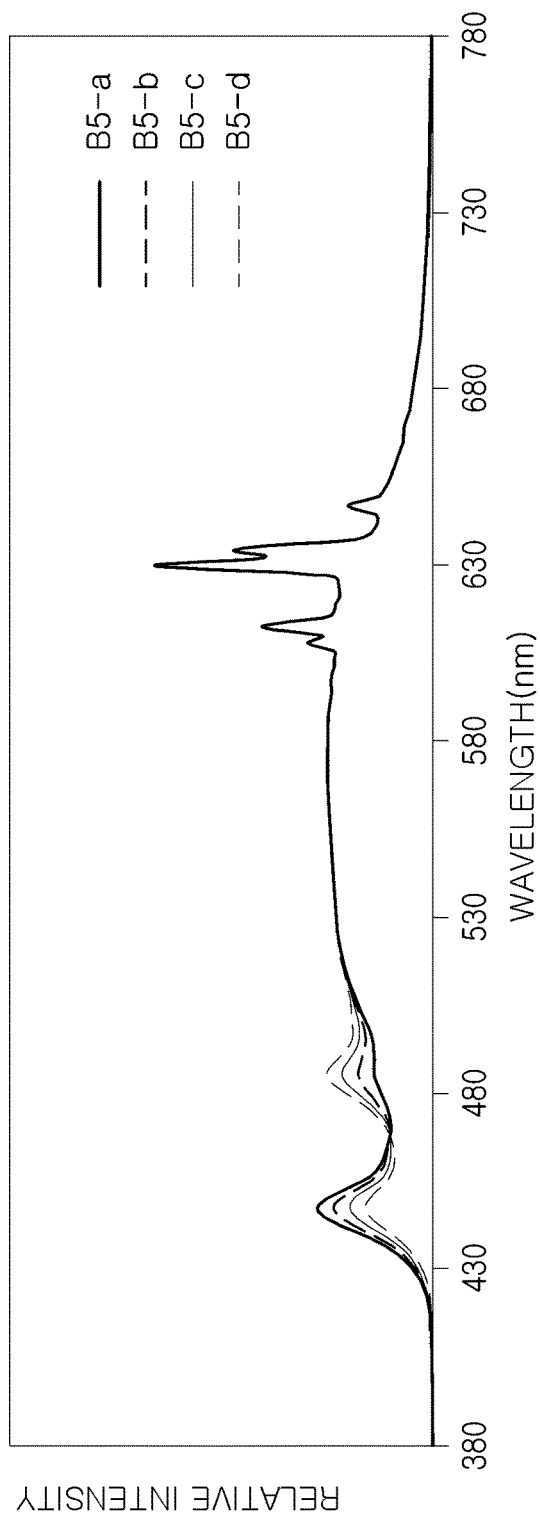

Spectrums of beams of white light were produced by changing relative intensity of the second blue light having a peak intensity at a wavelength of 485 nm with respect to the peak intensity of the first blue light, and the results are illustrated in FIG. 8B. Intensities of the spectrums, according to the example embodiments, were measured, and the results are shown in Table 14 below. The description manner of Table 14 is the same as that in Table 2 above.

TABLE 14

| Classification | B | SB | B + SB | SB/B | G1 | G2 | G2/SB |
|---|---|---|---|---|---|---|---|
| B5-a | 0.409 | 0.207 | 0.616 | 50.6% | 0.342 | 0.361 | 174.4% |
| B5-b | 0.351 | 0.263 | 0.614 | 74.9% | 0.343 | 0.361 | 137.3% |
| B5-c | 0.294 | 0.319 | 0.613 | 108.5% | 0.344 | 0.361 | 113.2% |
| B5-d | 0.236 | 0.375 | 0.611 | 158.9% | 0.345 | 0.361 | 96.3% |

The optical properties and human-centric indices of the respective spectrums of beams of white light were measured, and the results are shown in Table 15 below.

TABLE 15

| Classification | Optical Property | | | Human-Centric Index | | |
|---|---|---|---|---|---|---|
| | CCT (K) | CRI | LER (lm/W) | Rf | CAF | EML (lux) | BLH (μW/cm²) |
| P2 | 3996 | 90.1 | 334 | 88 | 0.59 | 69.7 | 4.70 |
| B5-a | 3991 | 91.1 | 336 | 90 | 0.58 | 71.0 | 4.38 |
| B5-b | 3986 | 91.7 | 338 | 90 | 0.58 | 72.3 | 4.06 |
| B5-c | 3977 | 90.1 | 342 | 84 | 0.56 | 75.0 | 3.44 |
| B5-d | 3975 | 89.1 | 343 | 82 | 0.56 | 75.6 | 3.28 |

As shown in Table 15 above, it can be seen that the human-centric indices are improved overall. For example, as compared to the Comparative Example (Spectrum P2) only using the first blue light without using the second blue light, the CRI values were maintained to be 90 or more, and the BLH values were significantly reduced (up to 73% in the case of Spectrum B5-c). However, in the wavelength conditions, it could be seen that when a relative intensity ratio of the second blue light to the first blue light was extremely great, for example, 158.9% (in Spectrum B5-d), the CRI was reduced to 89.1.

(IV-3) Second Blue Light (495 nm) (B7)

Figure 8C:
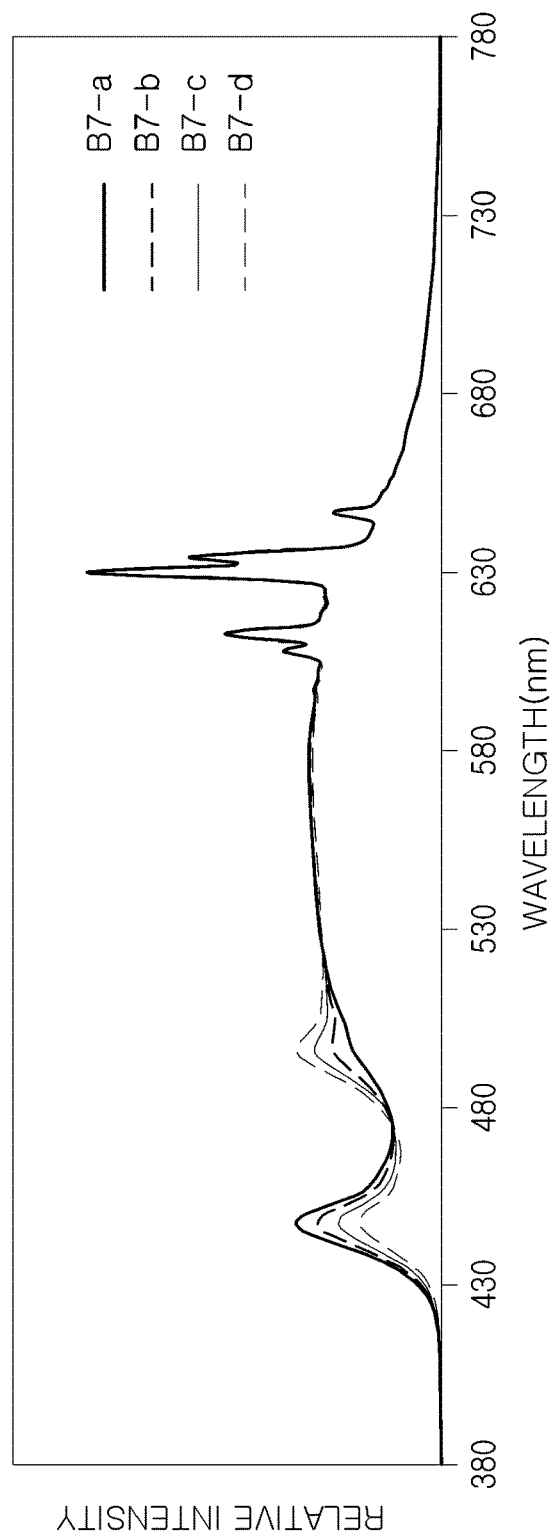

Spectrums of beams of white light were produced by changing relative intensity of the second blue light having a peak intensity at a wavelength of 495 nm with respect to the peak intensity of the first blue light, and the results are illustrated in FIG. 8C. Intensities of the spectrums, according to the example embodiments, were measured, and the results are shown in Table 16 below. The description manner of Table 16 is the same as that in Table 2 above.

TABLE 16

| Classification | B | SB | B + SB | SB/B | G1 | G2 | G2/SB |
|---|---|---|---|---|---|---|---|
| B7-a | 0.409 | 0.243 | 0.652 | 59.4% | 0.344 | 0.361 | 148.6% |
| B7-b | 0.351 | 0.3 | 0.651 | 85.5% | 0.346 | 0.361 | 120.3% |
| B7-c | 0.293 | 0.358 | 0.651 | 122.2% | 0.348 | 0.362 | 101.1% |
| B7-d | 0.235 | 0.415 | 0.65 | 176.6% | 0.35 | 0.362 | 87.2% |

The optical properties and human-centric indices of the respective spectrums of beams of white light were measured, and the results are shown in Table 17 below.

TABLE 17

| | Optical Property | | | | Human-Centric Index | |
|---|---|---|---|---|---|---|
| Classification | CCT (K) | CRI | LER (lm/W) | Rf | CAF | EML (lux) | BLH (μW/cm²) |
| P2 | 3996 | 90.1 | 334 | 88 | 0.59 | 69.7 | 4.70 |
| B7-a | 3995 | 91.1 | 337 | 90 | 0.58 | 70.7 | 4.29 |
| B7-b | 3995 | 91.7 | 340 | 90 | 0.56 | 71.7 | 3.89 |
| B7-c | 3994 | 91.3 | 343 | 88 | 0.55 | 72.7 | 3.50 |
| B7-d | 3993 | 89.7 | 347 | 84 | 0.54 | 73.7 | 3.11 |

In the present example embodiments, when a wavelength of the second blue light is 495 nm, the BLH values as well as the EML values are shown to be improved, unlike in the previous example embodiments of Spectrums A7-a to A7-d. For example, in the case of Spectrum B7-c, the BLH value may be significantly reduced to 74%. However, in some example embodiments of the current wavelength conditions, it could be seen that when an intensity ratio of the second blue light to the first blue light was greater than a certain value, for example, 176.6% as in Spectrum B7-d, the CRI was reduced to 89.7.

(V) Wavelength Condition of Second Blue Light (C)

The present example embodiments were conducted while changing relative intensity conditions of the second blue light with respect to the intensity of the first blue light.

Figure 9:
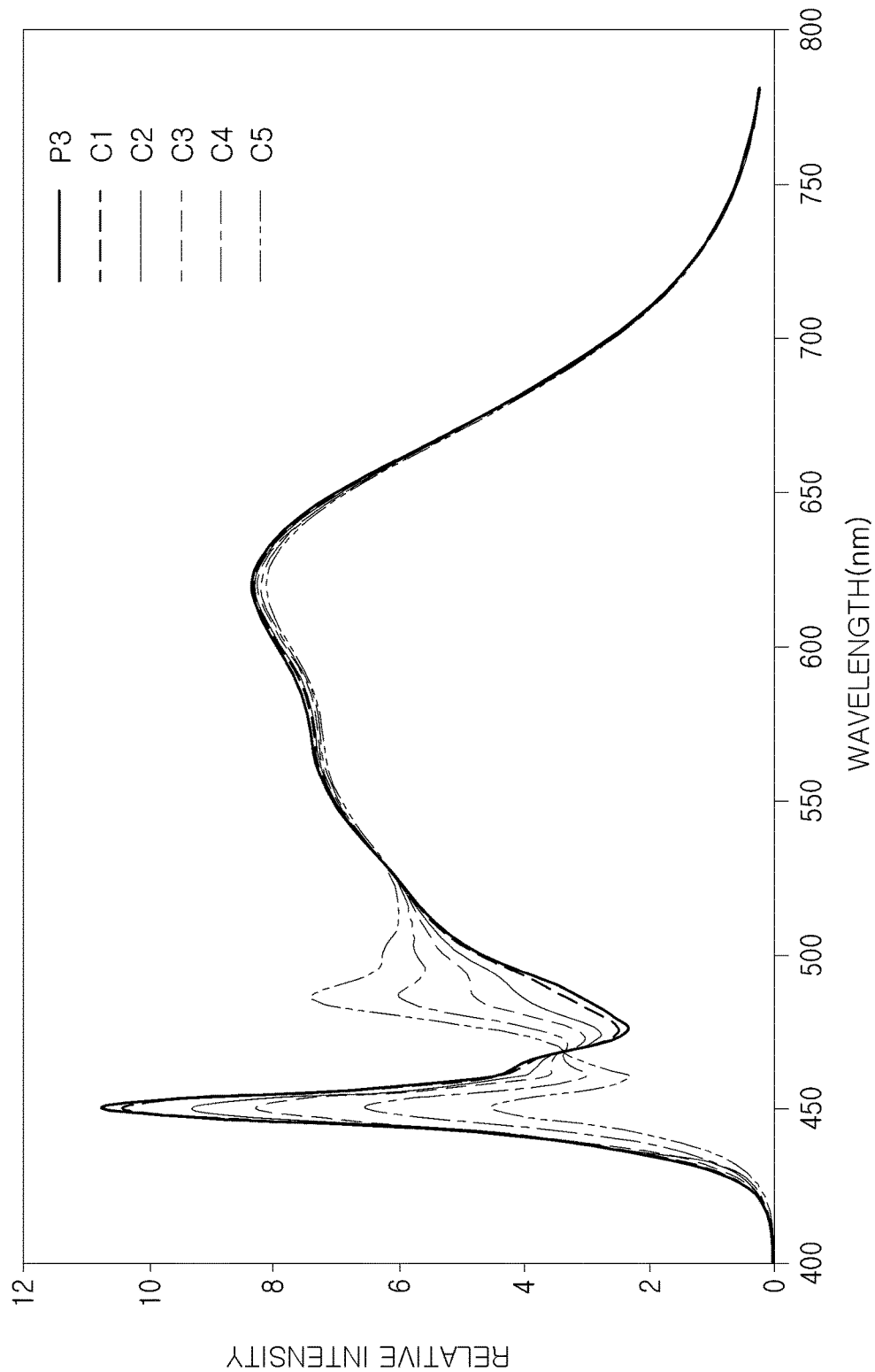
FIG. 9 is a graph illustrating light spectrums of beams of white light (changes in intensity ratio according to wavelength bands of blue light) emitted by a white light emitting device, according to example embodiments.

Similar to the previous example embodiment B, in the present example embodiments, two types of red phosphors corresponding to second light were used. For example, spectrums of beams of white light having a CCT of about 3,800 K and a CRI of 90 or more were designed by simulation, using a first LED emitting first blue light (B) having a peak intensity at a wavelength of 447 nm, a second LED emitting second blue light (SB) having a peak intensity at a wavelength of 485 nm, a YAG-based phosphor converting the first blue light (B) into first light (G) having a peak intensity at a wavelength of 545 nm, and two types of red phosphors (e.g., wavelength of a combination of 600 nm to 630 nm and 630 nm to 645 nm, or a combination of 615 nm to 625 nm and 625 nm to 635 nm) converting the first blue light (B) into second light (R). The spectrums of beams of white light were obtained by changing relative intensity of the second blue light (SB) with respect to the intensity of the first blue light B. The results are illustrated in FIG. 9. Intensities of the spectrums, according to the present example embodiments, were measured, and the results are shown in Table 18 below. The description manner of Table 18 is the same as that in Table 2 above.

TABLE 18

| Classification | B | SB | B + SB | SB/B | G1 | G2 | G2/SB |
|---|---|---|---|---|---|---|---|
| P3 | 0.978 | 0.432 | 1.41 | 44.2% | 0.748 | 0.848 | 196.3% |
| C1 | 0.951 | 0.457 | 1.408 | 48.1% | 0.748 | 0.848 | 185.6% |
| C2 | 0.872 | 0.532 | 1.404 | 61.0% | 0.75 | 0.848 | 159.4% |
| C3 | 0.793 | 0.612 | 1.405 | 77.2% | 0.751 | 0.848 | 138.6% |
| C4 | 0.661 | 0.743 | 1.404 | 112.4% | 0.753 | 0.848 | 114.1% |
| C5 | 0.502 | 0.899 | 1.401 | 179.1% | 0.755 | 0.848 | 94.3% |

The optical properties and human-centric indices of the respective spectrums of beams of white light were measured, and the results are shown in Table 19 below.

TABLE 19

| | Optical Property | | | | Human-Centric Index | |
|---|---|---|---|---|---|---|
| Classification | CCT (K) | CRI | LER (lm/W) | Rf | CAF | EML (lux) | BLH (μW/cm²) |
| P3 | 3819 | 92 | 293 | 89 | 0.59 | 70.1 | 4.70 |
| C1 | 3818 | 93 | 293 | 90 | 0.59 | 70.4 | 4.62 |
| C2 | 3816 | 93 | 295 | 91 | 0.58 | 71.1 | 4.36 |
| C3 | 3818 | 94 | 296 | 91 | 0.58 | 72.1 | 4.10 |
| C4 | 3820 | 93 | 299 | 88 | 0.57 | 73.6 | 3.68 |
| C5 | 3821 | 90 | 302 | 81 | 0.55 | 75.6 | 3.20 |

As shown in Table 19 above, it can be seen that as the relative intensities of the second blue light to the intensity of the first blue light are increased, the human-centric indices are improved overall. However, when a ratio (SB/B) of second blue light (SB) intensity to first blue light (B) intensity was lower than 50%, or when a ratio (G2/SB) of green light (G2) intensity to second blue light (SB) intensity exceeded 160%, the BLH values were higher than BLH values of a white light emitting device of other example embodiments at 3,800 K even though CRI values were maintained to be 90 or more.

Further, when the intensities of the second blue light are highly increased, the CRI values may be rather reduced (please see some example embodiments, e.g., Spectrums A1-e, A5-e, A7-e, B5-d, and B7-d).

As described above, the white light emitting devices, according to the example embodiments, may provide human-friendly white light emitting devices including BLH reduction effect while maintaining optical properties, such as CRI. The detailed spectrum conditions of white light may be slightly different, depending on a combination of phosphors. As in the above-mentioned example embodiments, the relative intensity conditions of spectrums may vary depending on types of red phosphors.

When at least one phosphor selected from among (Sr,Ca)AlSiN$_3$:Eu, CaAlSiN$_3$:Eu, and any combination thereof is used as a red phosphor, the at least one red phosphor may have a great full width at half maximum (FWHM) and low light emitting efficiency, as compared to a KSF phosphor. Thus, a profile of a spectrum of white light in a red light wavelength band may have a shape relatively gentler than a steep peak (please see, e.g., Spectrum A of FIG. 2, and FIGS. 5, 6A through 6C, and 10).

As can be seen from Spectrums A, A1 to A6, and C3 to C5 according to the previous example embodiments, similar characteristics may be exhibited in the spectrums of beams of white light. For example, when a peak intensity (or the maximum intensity) of the second light (red light) is 100, a peak intensity of the first blue light and a peak intensity of the second blue light may range from 50 to 110 and from 53 to 110, respectively. Further, the sum of the peak intensities of the first and second blue light may be in a range of 140 to 180. The maximum intensity may range from 70 to 90 in a green light wavelength band of 530 nm to 550 nm.

In contrast, when a $K_xSiF_y:Mn^{4+}$ ($2 \leq x \leq 3$, $4 \leq y \leq 7$) phosphor is used as a red phosphor, the $K_xSiF_y:Mn^{4+}$ phosphor may have a less full width at half maximum (FWHM) and a high light emitting efficiency, as compared to (Sr,Ca)AlSiN$_3$:Eu or CaAlSiN$_3$:Eu phosphor. Thus, a profile of a spectrum of white light in a red light wavelength band may have a steep peak (please see, e.g., Spectrum B of FIG. 2, and FIGS. 7, and 8A through 8C).

As can be seen from Spectrums B and B1 to B7 according to the previous example embodiments, when a peak intensity of the second light (red light) is 100 in the spectrums of beams of white light, peak intensities of the first blue light and the second blue light may range from 20 to 50, the sum of the peak intensities of the first blue light and the second blue light may be in a range of 58 to 67, and respective intensities of light having wavelengths of 530 nm and 550 nm may range from 30 to 40.

In additional example embodiments below, spectrums obtained by, and characteristics of, a white light emitting device, manufactured by a combination of phosphors, will be detailed.

Examples (A'1 to A'3) and Example (B')

In the present example embodiments, white light emitting devices, emitting white light meeting the above-mentioned conditions, were manufactured. The white light emitting devices were manufactured by using a first LED emitting first blue light (B) having a peak intensity at a wavelength of 447 nm, and by setting wavelength conditions of a second LED and green and red phosphors (G, R) to the conditions shown in Table 20 below. The above-mentioned YAG-based phosphor was used as the green phosphor.

TABLE 20

| Classification | SB | G | R |
|---|---|---|---|
| A'1 | 472 nm | 545 nm | (Sr, Ca)AlSiN$_3$:Eu and/or CaAlSiN$_3$:Eu |
| A'2 | 482 nm | 550 nm | |
| A'3 | 482 nm | 560 nm | |
| B' | 472 nm | 545 nm | KSF |

Figure 10:
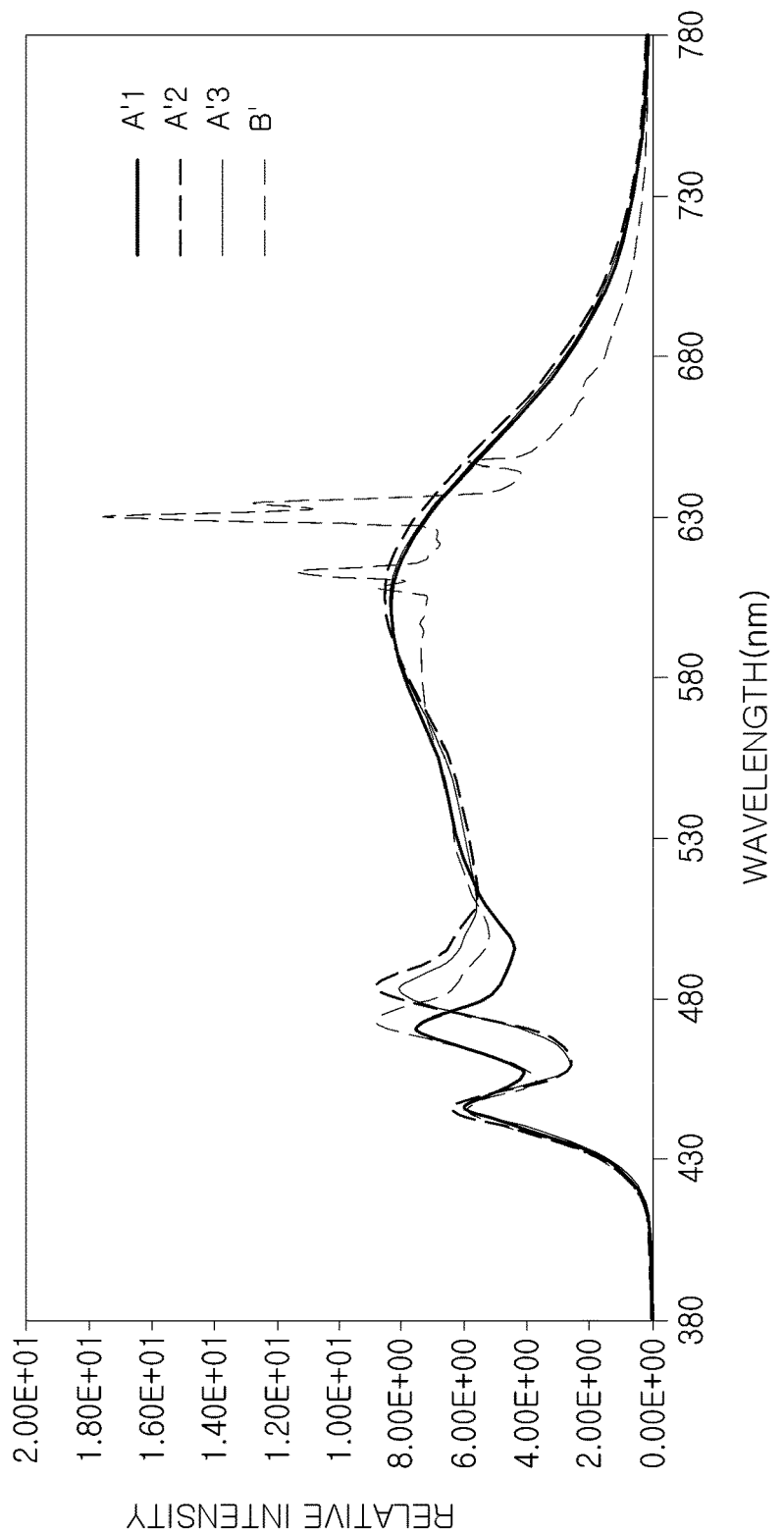
FIG. 10 is a graph illustrating light spectrums of beams of white light emitted by a white light emitting device, according to example embodiments.

Spectrums A'1 to A'3 and B' of beams of white light, emitted by the white light emitting devices manufactured under the conditions in Table 20 above, were measured, and the results are illustrated in FIG. 10. Further, intensities of Spectrums A'1 to A'3 and B' of beams of white light, according to the example embodiments, were measured, and the results are shown in Table 21 below.

TABLE 21

| Classification | B | SB | B + SB | SB/B | G1 | G2 | G2/SB |
|---|---|---|---|---|---|---|---|
| A'1 | 0.707 | 0.897 | 1.604 | 126.9% | 0.746 | 0.786 | 87.6% |
| A'2 | 0.742 | 1.023 | 1.765 | 137.9% | 0.682 | 0.737 | 72.0% |
| A'3 | 0.708 | 0.961 | 1.669 | 135.7% | 0.713 | 0.813 | 84.6% |
| B' | 0.329 | 0.498 | 0.827 | 151.4% | 0.358 | 0.375 | 75.3% |

The optical properties and human-centric indices of the respective spectrums of beams of white light were measured, and the results are shown in Table 22 below.

TABLE 22

| Classification | Optical Property | | | | Human-Centric Index | | |
|---|---|---|---|---|---|---|---|
| | CCT (K) | CRI | LER (lm/W) | Rf | CAF | EML (lux) | BLH (μW/cm²) |
| A'1 | 4029 | 90 | 311 | 86 | 0.635 | 78.0 | 4.70 |
| A'2 | 3944 | 90 | 303 | 87 | 0.648 | 82.5 | 4.58 |
| A'3 | 3966 | 90 | 309 | 86 | 0.628 | 80.3 | 4.56 |
| B' | 4166 | 94 | 316 | 86 | 0.691 | 85.5 | 5.10 |

As shown in Table 22 above, it can be seen that the human-centric indices are improved overall and the CRIs are maintained to be 90 or more.

As can be seen from Spectrums A'1 to A'3 according to some example embodiments, when a peak intensity of the red light is 100 in the spectrums of beams of white light, a peak intensity of the first blue light and a peak intensity of the second blue light may range from 70 to 75 and from 85 to 110, respectively, and the sum of the peak intensities of the first blue light and the second blue light may be in a range of 160 to 180. Further, in the spectrums of beams of white light, the maximum intensity in a wavelength band of 540 nm to 560 nm may be 72% to 88% of the peak intensity of the second blue light.

(VI) Relative Intensity Condition of Second Blue Light (D)

The present example embodiments were conducted while changing relative intensity conditions of the second blue light to the intensity of the first blue light.

A first LED, emitting first blue light (B) having a peak intensity at a wavelength of 450 nm, was used, and the remaining conditions were set to be similar to those in the previous example embodiment A. For example, spectrums of beams of white light having a CCT of about 6,000 K were designed by simulation, using a YAG-based phosphor converting the first blue light (B) into first light (G) having a peak intensity at a wavelength of 545 nm, and a red phosphor converting the first blue light (B) into second light (R) having a peak intensity at a wavelength within the range of 600 nm to 645 nm. The spectrums of beams of white light were obtained with respect to various wavelengths of second blue light (SB) as an additional component which is relatively softer (e.g., having longer wavelengths) than the first blue light B.

For example, the wavelength of the second blue light (SB) was changed to 460 nm, 485 nm, and 495 nm to obtain respective Spectrums (D1 to D3) of beams of white light, and Spectrum P4 of white light obtained without using a second LED, for comparison with Spectrums D1 to D3. The spectrums of beams of white light were produced by changing a ratio of the first blue light intensity to the second blue light intensity in the following example embodiments (e.g., Spectrums D1 to D3). Hereinafter, example embodiments having different ratios of the second blue light intensity to the first blue light intensity will be described with respect to different wavelengths of the second blue light.

(VI-1) Second Blue Light (460 nm) (D1)

Figure 11A:
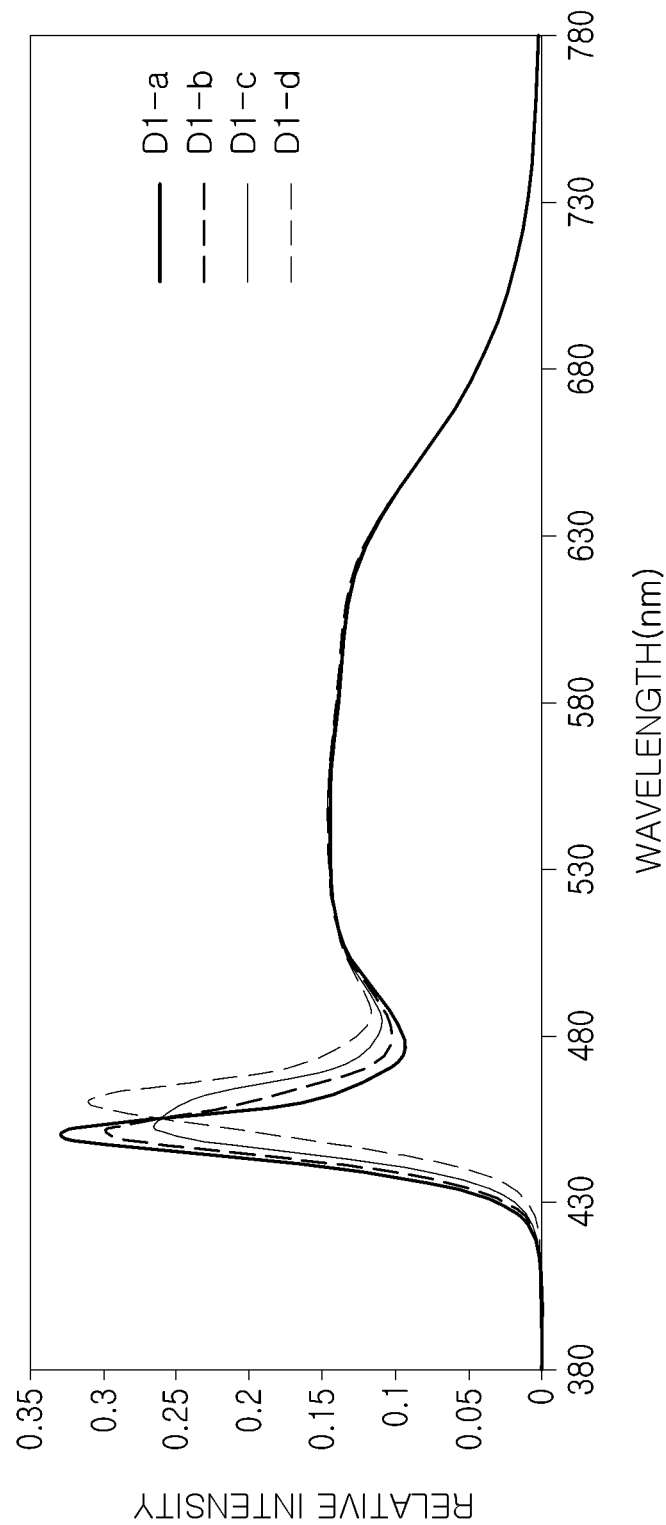
FIGS. 11A through 11C are graphs illustrating light spectrums of beams of white light (changes in intensity ratio according to wavelength bands of second blue light, at 6,000 K) emitted by a white light emitting device, according to example embodiments.

Spectrums of beams of white light were produced by changing relative intensity of the second blue light having a peak intensity at a wavelength of 460 nm with respect to the first blue light, and the results are illustrated in FIG. 11A. Intensities of the spectrums, according to the present example embodiments, were measured, and the results are shown in Table 23 below. The description manner of Table 23 is the same as that in Table 2 above.

TABLE 23

| Classification | B | SB | B + SB | SB/B | G1 | G2 | G2/SB |
|---|---|---|---|---|---|---|---|
| D1-a | 2.16 | 1.48 | 3.64 | 68.5% | 1.07 | 1.07 | 72.3% |
| D1-b | 1.83 | 1.81 | 3.64 | 98.9% | 1.07 | 1.07 | 59.1% |
| D1-c | 1.34 | 2.29 | 3.63 | 170.9% | 1.07 | 1.07 | 46.7% |
| D1-d | 1.33 | 2.3 | 3.63 | 172.9% | 1.07 | 1.07 | 46.5% |

The optical properties and human-centric indices of the respective spectrums of beams of white light were measured, and the results are shown in Table 24 below.

TABLE 24

| | Optical Property | | | | Human-Centric Index | |
|---|---|---|---|---|---|---|
| Classification | CCT (K) | CRI | LER (lm/W) | Rf | CAF | EML (lux) | BLH (µW/cm²) |
| P4 | 5912 | 91.8 | 296 | 88.7 | 0.873 | 89.6 | 7.60 |
| D1-a | 5917 | 92.1 | 296 | 88.4 | 0.878 | 100.4 | 7.44 |
| D1-b | 5920 | 91.8 | 297 | 87.0 | 0.883 | 102.5 | 7.22 |
| D1-c | 5912 | 90.0 | 298 | 83.4 | 0.889 | 105.6 | 6.87 |
| D1-d | 5911 | 90.0 | 298 | 83.3 | 0.889 | 105.6 | 6.86 |

As shown in Table 24 above, it can be seen that the human-centric indices are improved overall. For example, as compared to the Comparative Example (Spectrum P4) which is not using the second blue light but using the first blue light only, the CRI values were maintained to be 90 or more, and the BLH values were reduced in the present example embodiments. In the present wavelength conditions, it could be seen that as a relative intensity ratio of the second blue light to the first blue light was increased, the BLH values were improved, but the CRI values were gradually reduced.

(VI-2) Second Blue Light (485 nm) (D2)

Figure 11B:
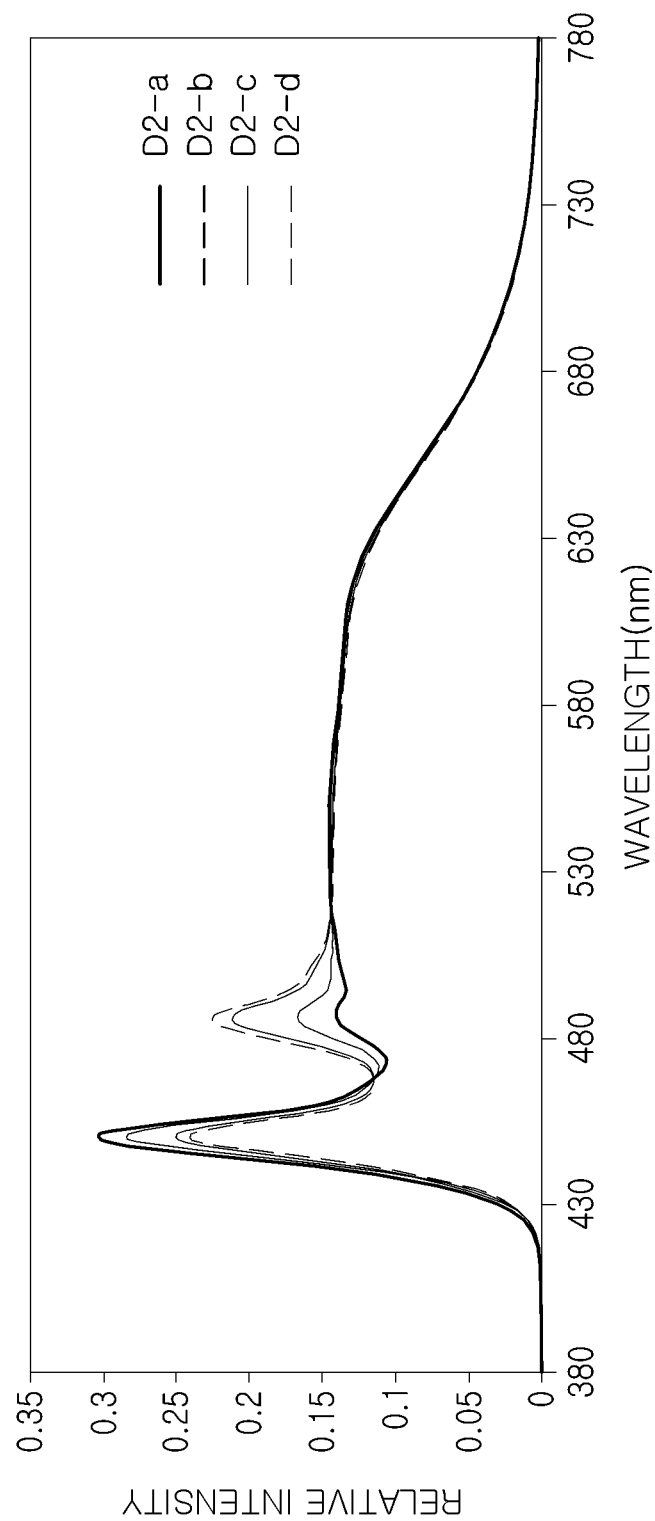

Spectrums of beams of white light were produced by changing relative intensity of the second blue light having a peak intensity at a wavelength of 485 nm with respect to the first blue light, and the results are illustrated in FIG. 11B. Intensities of the spectrums of the present example embodiments were measured, and the results are shown in Table 25 below. The description manner of Table 25 is the same as that in Table 2 above.

TABLE 25

| Classification | B | SB | B + SB | SB/B | G1 | G2 | G2/SB |
|---|---|---|---|---|---|---|---|
| D2-a | 2.23 | 1.03 | 3.26 | 52.9% | 1.07 | 1.07 | 103.9% |
| D2-b | 2.09 | 1.23 | 3.32 | 58.9% | 1.07 | 1.07 | 87.0% |
| D2-c | 1.87 | 1.59 | 3.46 | 85.0% | 1.08 | 1.07 | 67.3% |
| D2-d | 1.8 | 1.69 | 3.49 | 93.9% | 1.08 | 1.07 | 63.3% |

The optical properties and human-centric indices of the respective spectrums of beams of white light were measured, and the results are shown in Table 26 below.

TABLE 26

| | Optical Property | | | | Human-Centric Index | |
|---|---|---|---|---|---|---|
| Classification | CCT (K) | CRI | LER (lm/W) | Rf | CAF | EML (lux) | BLH (µW/cm²) |
| P4 | 5912 | 91.8 | 296 | 88.7 | 0.873 | 98.6 | 7.60 |
| D2-a | 5916 | 93 | 296 | 89.6 | 0.880 | 102.2 | 7.34 |
| D2-b | 5913 | 92 | 297 | 89.0 | 0.883 | 104.6 | 7.14 |
| D2-c | 5917 | 91 | 297 | 86.0 | 0.889 | 108.7 | 6.83 |
| D2-d | 5919 | 90 | 297 | 84.8 | 0.891 | 109.9 | 6.73 |

As shown in Table 26 above, it can be seen that the human-centric indices are improved overall. For example, as compared to the Comparative Example (Spectrum P4) only using the first blue light without using the second blue light, the CRI values were maintained to be 90 or more, and the BLH values were reduced. In the present wavelength conditions, it could be seen that as an intensity ratio of the second blue light to the first blue light was increased, the BLH values were improved, but the CRI values were gradually reduced.

(VI-3) Second Blue Light (495 nm) (D3)

Figure 11C:
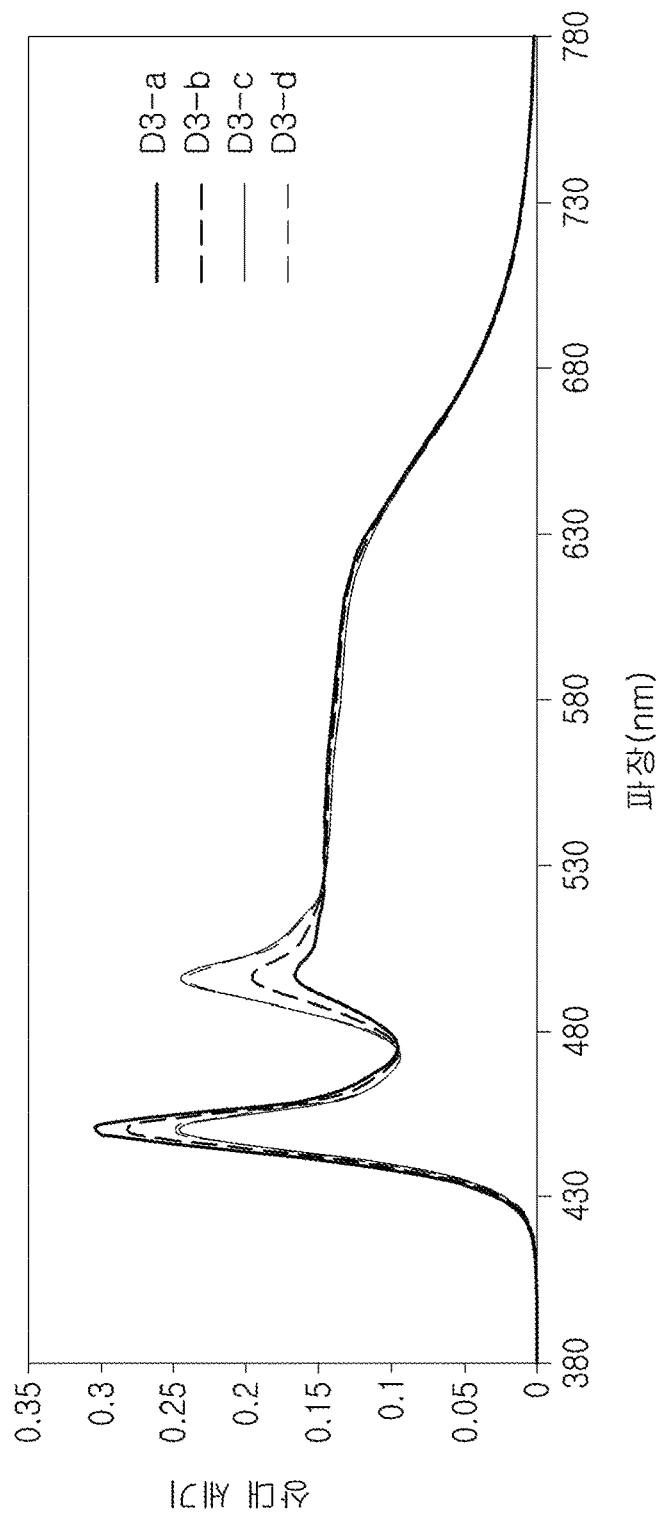

Spectrums of beams of white light were produced by changing relative intensity of the second blue light having a peak intensity at a wavelength of 495 nm with respect to the first blue light, and the results are illustrated in FIG. 11C. Intensities of the spectrums, according to the present example embodiments, were measured, and the results are shown in Table 27 below. The description manner of the Table 27 is the same as that in Table 2 above.

TABLE 27

| Classification | B | SB | B + SB | SB/B | G1 | G2 | G2/SB |
|---|---|---|---|---|---|---|---|
| D3-a | 2.23 | 1.21 | 3.44 | 54.3% | 1.08 | 1.07 | 88.4% |
| D3-b | 2.09 | 1.45 | 3.54 | 69.4% | 1.09 | 1.07 | 73.8% |
| D3-c | 1.89 | 1.83 | 3.72 | 96.8% | 1.1 | 1.07 | 58.5% |
| D3-d | 1.87 | 1.86 | 3.73 | 99.5% | 1.1 | 1.07 | 57.5% |

The optical properties and human-centric indices of the respective spectrums of beams of white light were measured, and the results are shown in Table 28 below.

TABLE 28

| | Optical Property | | | | Human-Centric Index | |
|---|---|---|---|---|---|---|
| Classification | CCT (K) | CRI | LER (lm/W) | Rf | CAF | EML (lux) | BLH (µW/cm²) |
| P4 | 5912 | 91.8 | 296 | 88.7 | 0.873 | 98.6 | 7.60 |
| D3-a | 5919 | 93 | 298 | 90.2 | 0.872 | 102.6 | 7.18 |
| D3-b | 5914 | 92 | 299 | 89.3 | 0.870 | 105.0 | 6.87 |
| D3-c | 5919 | 90 | 301 | 86.3 | 0.868 | 109.0 | 6.42 |
| D3-d | 5914 | 90 | 301 | 85.9 | 0.867 | 109.2 | 6.37 |

As shown in Table 28 above, it can be seen that the human-centric indices are improved overall. For example, as compared to the Comparative Example (Spectrum P4) only using the first blue light without using the second blue light, the CRI values were maintained to be 90 or more, and the BLH values were reduced. When a wavelength of the second blue light was 495 nm, the BLH values were improved further than those in other example embodiments (e.g., Spectrums D1 and D2).

As described above, the white light emitting devices of the present example embodiments may provide white light for human-friendly illumination maintaining optical properties, such as CRI, together with a BLH reduction effect.

The detailed spectrums and their conditions of white light may vary, depending on a combination of phosphors. As in the above-mentioned example embodiments, the detailed spectrum conditions may be significantly changed, depending on types of red phosphors, relative intensity conditions between the first and second blue lights and CCT ranges.

In a case in which white light having a CCT ranging from 5,700 K to 6,700 K is provided using at least one selected from among (Sr,Ca)AlSiN$_3$:Eu, CaAlSiN$_3$:Eu, and any combination thereof as a red phosphor, when a peak intensity (or the maximum intensity) of the second light (red light) is 100, a peak intensity of the first blue light and a peak intensity of the second blue light may range from 130 to 230 and from 100 to 230, respectively. Further, the sum of the peak intensities of the first and second blue light may be in a range of 340 to 380. The maximum intensity may range from 100 to 120 in a green light wavelength band of 530 nm to 550 nm.

(VII) Relative Intensity Condition of Second Blue Light (E)

The present example embodiments were conducted while changing relative intensity conditions of the second blue light with respect to the first blue light.

Similar to the previous example embodiments, the present example embodiments were conducted using a KSF phosphor as a red phosphor. For example, spectrums of beams of white light having a CCT of about 6,500 K and a CRI of 90 or more were designed by simulation, using a first LED emitting first blue light (B) having a peak intensity at a wavelength of 450 nm, a YAG-based phosphor converting the first blue light (B) into first light (G) having a peak intensity at a wavelength of 545 nm, and a KSF red phosphor converting the first blue light (B) into second light (R). The spectrums of beams of white light were obtained by using an additional component of second blue light (SB) with respect to different wavelengths of second blue light (SB) relatively softer than the first blue light.

For example, the wavelength of the second blue light was changed to 460 nm, 485 nm, or 495 nm to obtain respective Spectrums (E1 to E3) of beams of white light, and a spectrum P5 of white light was obtained without using a second LED to compare with Spectrums (E1 to E3). Further, spectrums of beams of white light were produced with respect to various ratios of second blue light intensity to first blue light intensity in example embodiments corresponding to Spectrums E1 to E3. Hereinafter, the ratios of the second blue light intensity to the first blue light intensity and their characteristics will be described according to different wavelengths of the second blue light.

(VII-1) Second Blue Light (460 nm) (E1)

Figure 12A:
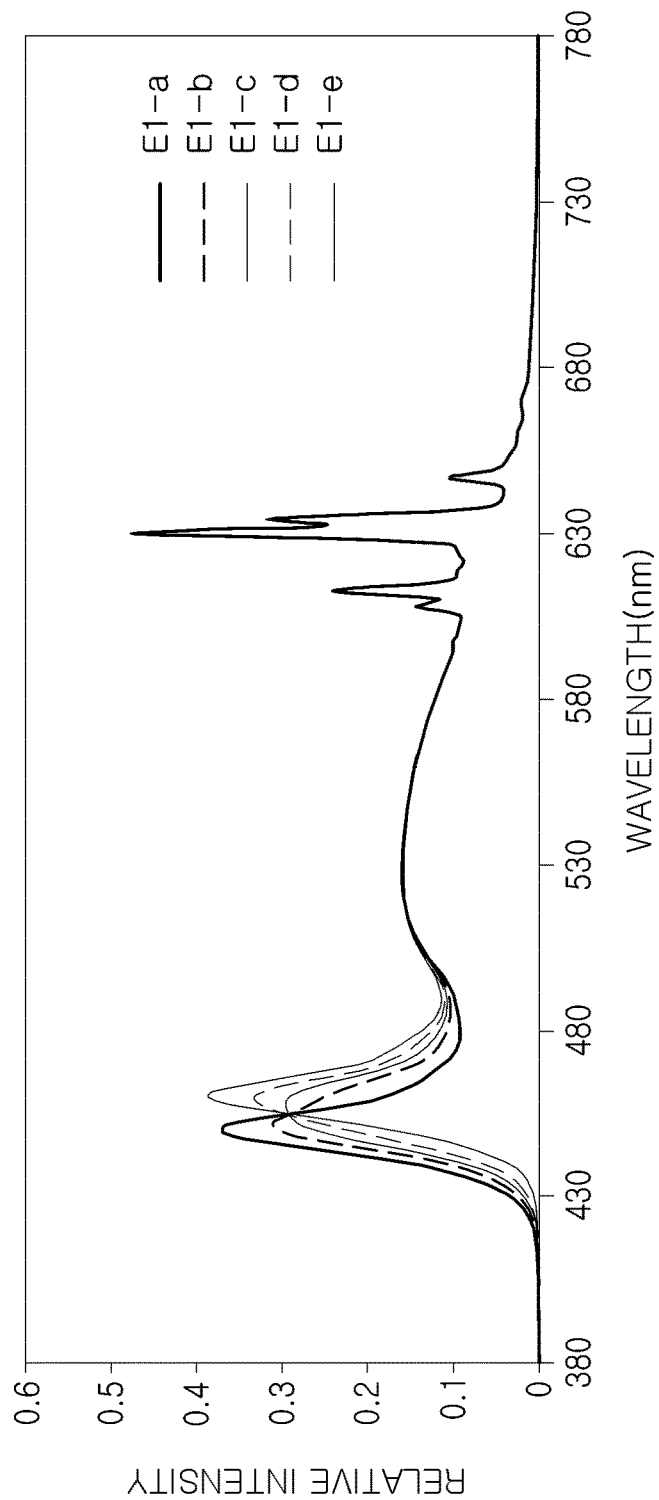
FIGS. 12A through 12C are graphs illustrating light spectrums of beams of white light (changes in intensity ratio according to wavelength bands of second blue light, at 6,500 K) emitted by a white light emitting device, according to example embodiments.

Spectrums of beams of white light were produced by changing relative intensity of the second blue light having a peak intensity at a wavelength of 460 nm with respect to the first blue light, and the results are illustrated in FIG. 12A. Intensities of the spectrums of the example embodiments were measured, and the results are shown in Table 29 below. The description manner of Table 29 is similar to that in Table 2 above.

TABLE 29

| Classification | B | SB | B + SB | SB/B | G1 | G2 | G2/SB |
|---|---|---|---|---|---|---|---|
| E1-a | 0.63 | 0.53 | 1.16 | 84.1% | 0.34 | 0.32 | 60.4% |
| E1-b | 0.55 | 0.62 | 1.17 | 112.7% | 0.34 | 0.32 | 51.6% |
| E1-c | 0.46 | 0.70 | 1.16 | 152.2% | 0.34 | 0.32 | 45.7% |
| E1-d | 0.35 | 0.82 | 1.17 | 234.3% | 0.34 | 0.32 | 39.0% |

The optical properties and human-centric indices of the respective spectrums of beams of white light were measured, and the results are shown in Table 30 below.

TABLE 30

| | Optical Property | | | | Human-Centric Index | | |
|---|---|---|---|---|---|---|---|
| Classification | CCT (K) | CRI | LER (lm/W) | Rf | CAF | EML (lux) | BLH (µW/cm$^2$) |
| P5 | 6512 | 94.8 | 305 | 90.1 | 0.930 | 104.1 | 8.31 |
| E1-a | 6504 | 96.5 | 306 | 89.6 | 0.938 | 107.3 | 7.97 |
| E1-b | 6506 | 95.9 | 306 | 88.1 | 0.943 | 109.3 | 7.78 |
| E1-c | 6508 | 95.0 | 306 | 85.9 | 0.948 | 111.3 | 7.59 |
| E1-d | 6511 | 92.8 | 307 | 82.3 | 0.955 | 114.0 | 7.34 |

As shown in Table 30 above, it can be seen that the human-centric indices are improved overall. As compared to the Comparative Example (Spectrum P5) only using the first blue light without using the second blue light, the CRI values were maintained to be 90 or more, and the BLH values were reduced.

(VII-2) Second Blue Light (485 nm) (E2)

Figure 12B:
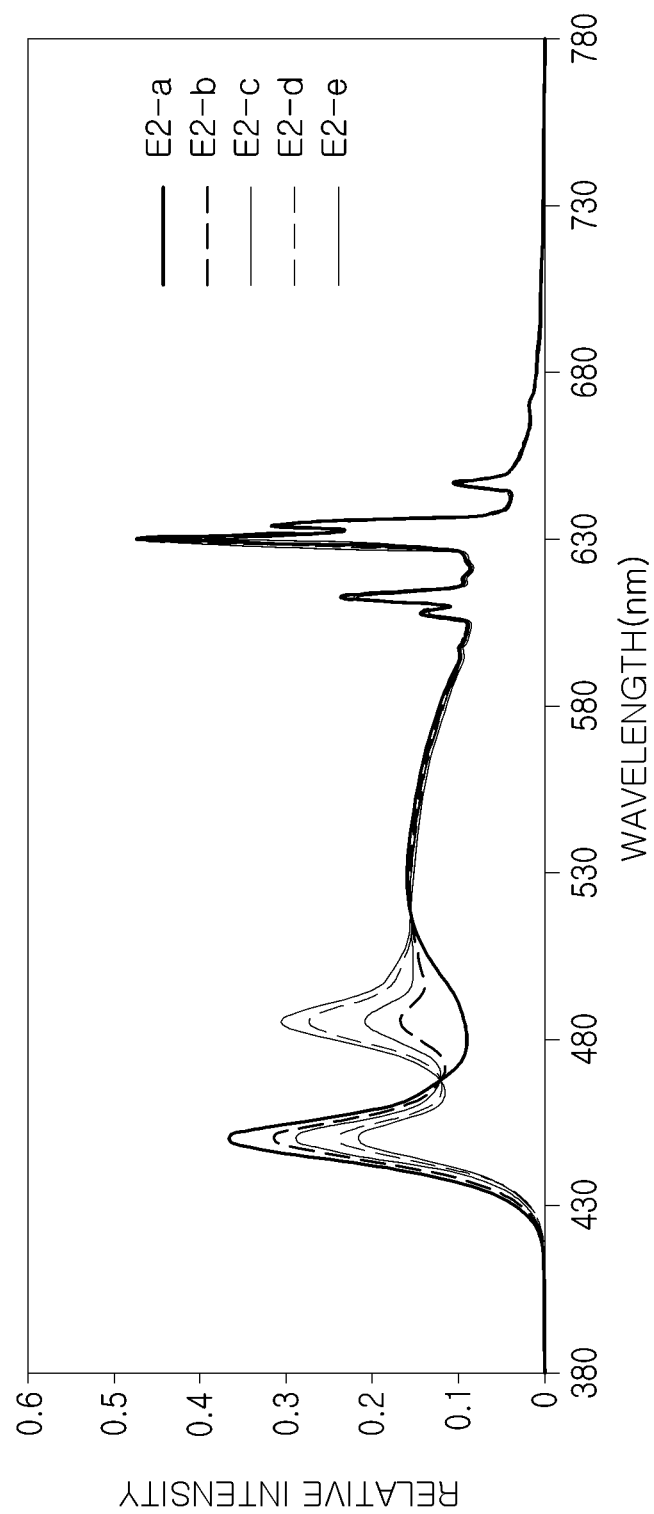

Spectrums of beams of white light were produced by changing relative intensity of the second blue light having a peak intensity at a wavelength of 485 nm with respect to the first blue light, and the results are illustrated in FIG. 12B. Intensities of the spectrums of the example embodiments were measured, and the results are shown in Table 31 below. The description manner of Table 31 is similar to that in Table 2 above.

TABLE 31

| Classification | B | SB | B + SB | SB/B | G1 | G2 | G2/SB |
|---|---|---|---|---|---|---|---|
| E2-a | 0.676 | 0.353 | 1.029 | 52.2% | 0.338 | 0.32 | 90.7% |
| E2-b | 0.628 | 0.336 | 0.964 | 53.5% | 0.339 | 0.32 | 95.2% |
| E2-c | 0.532 | 0.301 | 0.833 | 56.6% | 0.341 | 0.321 | 106.6% |
| E2-d | 0.483 | 0.283 | 0.766 | 58.6% | 0.342 | 0.321 | 113.4% |

The optical properties and human-centric indices of the respective spectrums of beams of white light were measured, and the results are shown in Table 32 below.

TABLE 32

| | Optical Property | | | | Human-Centric Index | | |
|---|---|---|---|---|---|---|---|
| Classification | CCT (K) | CRI | LER (lm/W) | Rf | CAF | EML (lux) | BLH (µW/cm$^2$) |
| P5 | 6512 | 94.8 | 305 | 90.1 | 0.930 | 104.1 | 8.31 |
| E2-a | 6507 | 97.5 | 305 | 90.8 | 0.944 | 111.0 | 7.83 |
| E2-b | 6536 | 95.8 | 304 | 88.2 | 0.955 | 115.1 | 7.62 |
| E2-c | 6506 | 90.8 | 305 | 82.4 | 0.963 | 121.1 | 7.14 |
| E2-d | 6498 | 88.2 | 305 | 79.2 | 0.968 | 124.1 | 6.91 |

As shown in Table 32 above, it can be seen that the human-centric indices are improved overall. For example, as compared to the Comparative Example (Spectrum P5) only using the first blue light without using the second blue light, the CRI values were maintained to be 90 or more and the BLH values were reduced in the example embodiments except for the example embodiment corresponding to Spectrum E2-d. However, in the example embodiment of Spectrum E2-d in which a peak intensity of the second blue light was lower than or equal to 0.3 (for example, 0.283), and in which the sum of peak intensities of the first blue light and the second blue light was lower than or equal to 0.8 (for example, 0.766), the CRI was reduced to 88.2.

(VII-3) Second Blue Light (495 nm) (E3)

Figure 12C:
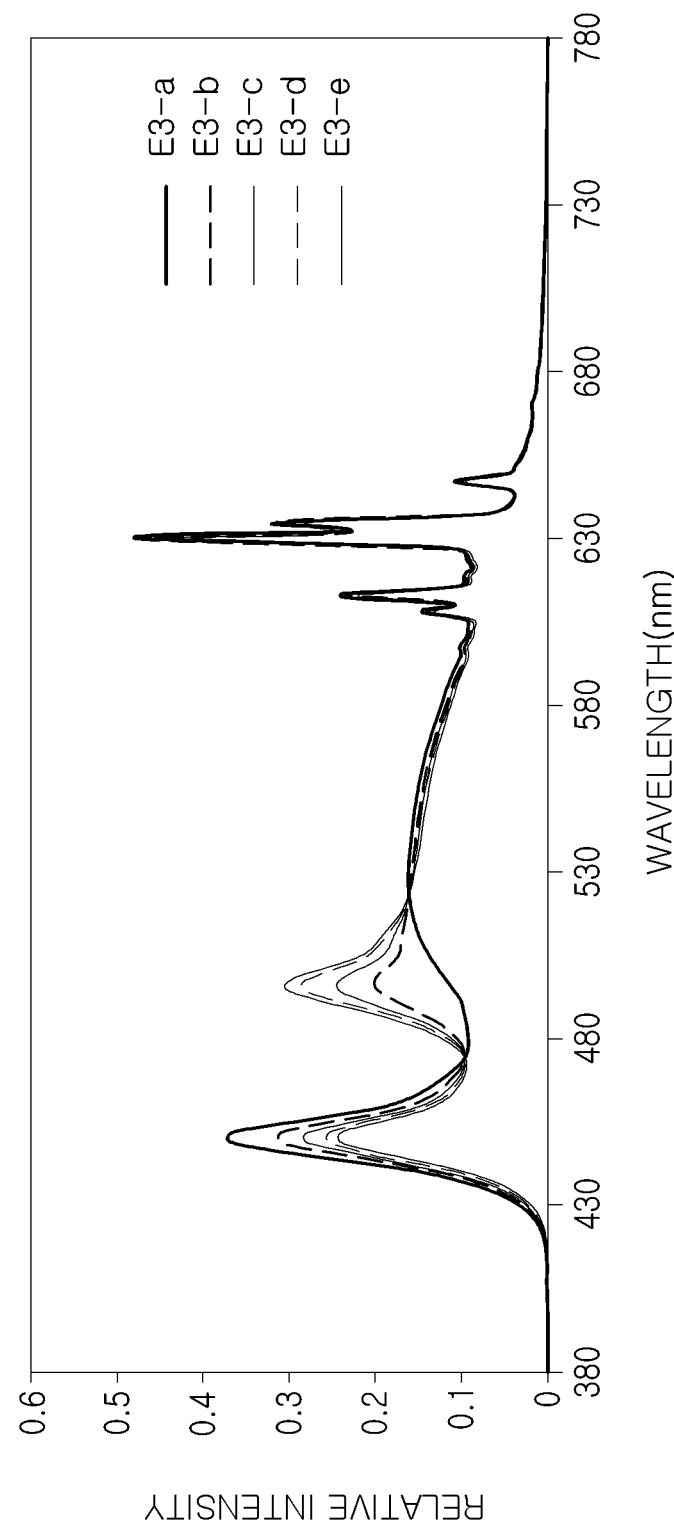

Spectrums of beams of white light were produced by changing relative intensity of the second blue light having a peak intensity at a wavelength of 495 nm with respect to the first blue light, and the results are illustrated in FIG. 12C. Intensities of the spectrums of the example embodiments were measured, and the results are shown in Table 33 below. The description manner of Table 33 is similar to that in Table 2 above.

TABLE 33

| Classification | B | SB | B + SB | SB/B | G1 | G2 | G2/SB |
|---|---|---|---|---|---|---|---|
| E3-a | 0.676 | 0.348 | 1.024 | 51.5% | 0.343 | 0.321 | 92.2% |
| E3-b | 0.627 | 0.328 | 0.955 | 52.3% | 0.347 | 0.321 | 97.9% |
| E3-c | 0.578 | 0.308 | 0.886 | 53.3% | 0.351 | 0.322 | 104.5% |
| E3-d | 0.554 | 0.299 | 0.853 | 54.0% | 0.353 | 0.322 | 107.7% |

The optical properties and human-centric indices of the respective spectrums of beams of white light were measured, and the results are shown in Table 34 below.

TABLE 34

| | Optical Property | | | Human-Centric Index | | |
|---|---|---|---|---|---|---|
| Classification | CCT (K) | CRI | LER (lm/W) | Rf | CAF | EML (lux) | BLH (μW/cm²) |
| P5 | 6512 | 94.8 | 305 | 90.1 | 0.930 | 104.1 | 8.31 |
| E3-a | 6499 | 97.1 | 308 | 90.7 | 0.930 | 111.9 | 7.50 |
| E3-b | 6508 | 94.5 | 309 | 87.7 | 0.932 | 116.0 | 7.13 |
| E3-c | 6507 | 91.5 | 310 | 84.3 | 0.933 | 119.7 | 6.76 |
| E3-d | 6507 | 89.9 | 310 | 82.5 | 0.933 | 121.5 | 6.59 |

In the example embodiments, when a wavelength of the second blue light is 495 nm, the BLH values as well as the EML values were significantly improved. However, in the example embodiment corresponding to Spectrum E3-d in which a peak intensity of the second blue light was lower than or equal to 0.3 (for example, 0.299), the CRI was reduced to 89.9.

As described above, the white light emitting devices, according to the example embodiments, may provide white light for human-friendly lighting to maintain optical properties, such as CRI, together with a BLH reduction effect.

The detailed spectrum conditions of white light may be slightly different depending on a combination of phosphors. As in the above-mentioned example embodiments, the detailed spectrum conditions may be changed, depending on types of red phosphors, relative intensity conditions between the first and second blue lights, and CCT ranges.

In a case in which white light having a CCT of 5,700 K to 6,700 K is provided using a $K_xSiF_y:Mn^{4+}$ phosphor ($2 \leq x \leq 3$, $4 \leq y \leq 7$) as a red phosphor as in example embodiments (e.g., E1 to E3), when a peak intensity of the second light (e.g., red light) is 100 in the spectrums of beams of white light, peak intensities of the first blue light and the second blue light may range from 30 to 90, the sum of the peak intensities of the first blue light and the second blue light may be in a range of 80 to 120, and a ratio (G2/SB) of intensity of the green light (G2) of each of the spectrums of beams of white light at 550 nm to the peak intensity of the second blue light may be within a range of 107 or less, according to example embodiments E1 to E3.

When examining the previous two example embodiments D and E (e.g., D1-a~D3-d and E1-a~E3-e), it could be seen that when a peak intensity ratio of the second blue light to the first blue light was 40% or more, and when the ratio of the peak intensity of the second blue light to the maximum intensity at 520 nm to 560 nm is equal to 40% to 107% in the spectrums of beams of white light having a relatively high CCT (for example, 5,700 K to 6,700 K), a white light for human-friendly lighting may be provided to maintain optical properties, such as CRI, together with a BLH reduction effect.

BLH Improvement Effect According to CCT (1)

Figure 13:
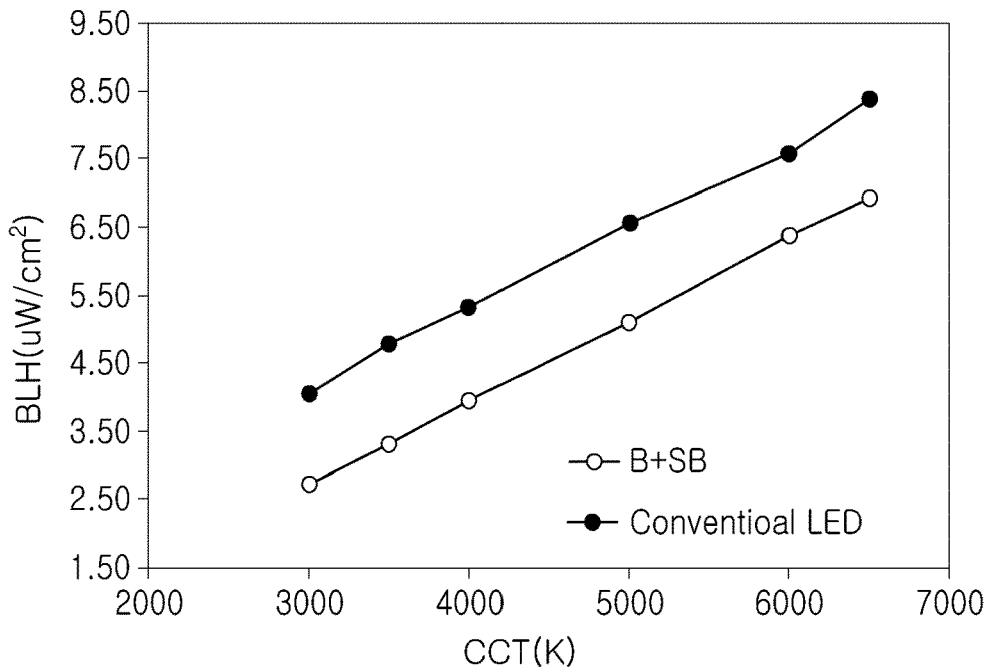
FIG. 13 is a graph illustrating the range of blue light hazard (BLH) indices (@100 lux), according to changes in correlated color temperature (CCT), according to example embodiment D.

The BLH improvement effects of white light according to the example embodiments, were measured depending on changes in CCT. First, the BLH indices (@100 lux) were measured by changing CCT conditions of the white light having a CRI higher than 90 obtained under conditions similar to those in some example embodiments (e.g., embodiments A and D) of the previous example embodiments, and were compared to the BLH indices (@100 lux) of the white light of the Comparative Examples (conventional LED without using second blue light) according to CCTs. The results are illustrated in FIG. 13.

Further, based on the measured results, the available BLH index ranges according to the CCT ranges, are summarized in Table 35.

TABLE 35

| CCT | BLH |
|---|---|
| 3,000K to 3,250K | 2.7 to 4.4 |
| 3,250K to 3,500K | 3.0 to 4.7 |
| 3,500K to 3,750K | 3.3 to 5.0 |
| 3,750K to 4,000K | 3.6 to 5.3 |
| 4,000K to 4,250K | 3.9 to 5.6 |
| 4,250K to 4,500K | 4.2 to 5.9 |
| 4,500K to 4,750K | 4.5 to 6.2 |
| 4,750K to 5,000K | 4.8 to 6.5 |
| 5,000K to 5,250K | 5.1 to 6.8 |
| 5,250K to 5,500K | 5.4 to 7.1 |
| 5,500K to 5,750K | 5.7 to 7.4 |
| 5,750K to 6,000K | 6.0 to 7.7 |
| 6,000K to 6,250K | 6.3 to 8.0 |
| 6,250K to 6,500K | 6.6 to 8.3 |

For example, when the CCT of white light ranges from 3,750 K to 4,250 K, the white light may have the BLH indices ranging from 3.6 to 5.6 as shown in example embodiments A and D, and when the CCT of white light ranges from 5,750 K to 6,250 K, the white light may have the BLH indices ranging from 6.0 to 8.0 as shown also in example embodiments A and D.

BLH Improvement Effect According to CCT (2)

Figure 14:
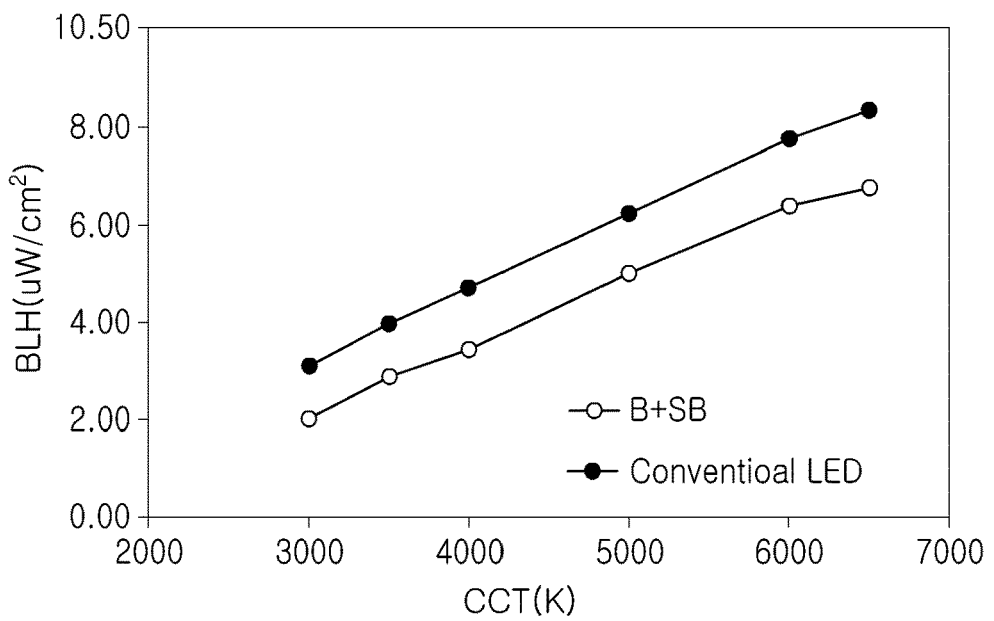
FIG. 14 is a graph illustrating the range of BLH indices (@100 lux), according to changes in CCT, according to example embodiment E.

A CCT dependence of the BLH improvement effect of white light of the example embodiments, were measured. First, the BLH indices (@100 lux) were measured by changing CCT conditions of the white light having a CRI higher than 90 obtained under conditions similar to those in some example embodiments (e.g., embodiments B and E) of the previous example embodiments, and were compared to the BLH indices (@100 lux) of the white light of the Comparative Examples (excluding second blue light) according to different CCTs. The results are illustrated in FIG. 14.

Further, based on the measured results, the available BLH index ranges, according to the CCT ranges, are summarized in table 36.

TABLE 36

| CCT | BLH |
|---|---|
| 3,000K to 3,250K | 2.0 to 3.6 |
| 3,250K to 3,500K | 2.5 to 4.0 |
| 3,500K to 3,750K | 2.8 to 4.4 |
| 3,750K to 4,000K | 3.2 to 4.8 |
| 4,000K to 4,250K | 3.5 to 5.1 |
| 4,250K to 4,500K | 3.9 to 5.5 |
| 4,500K to 4,750K | 4.2 to 5.9 |
| 4,750K to 5,000K | 4.6 to 6.3 |
| 5,000K to 5,250K | 4.9 to 6.7 |
| 5,250K to 5,500K | 5.3 to 7.1 |
| 5,500K to 5,750K | 5.6 to 7.5 |
| 5,750K to 6,000K | 6.0 to 7.9 |
| 6,000K to 6,250K | 6.3 to 8.3 |
| 6,250K to 6,500K | 6.7 to 8.7 |

For example, when the CCT of white light ranges from 3,750 K to 4,250 K, the white light may have BLH indices ranging from 3.2 to 5.1 as shown in the example embodiments B and E, and when the CCT of white light ranges from 6,250 K to 6,500 K, the white light may have the BLH indices ranging from 6.7 to 8.7 as also shown in the example embodiments B and E.

The white light emitting devices, according to the example embodiments, may be used as human-friendly functional lighting devices.

Figure 15:
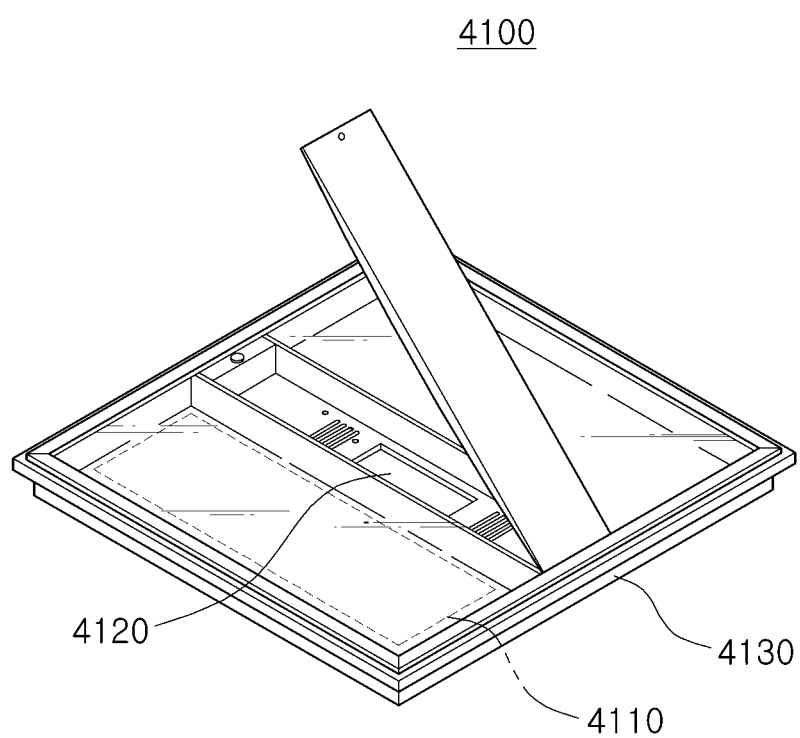
FIG. 15 is a perspective view schematically illustrating a flat lighting device, according to an example embodiment.

FIG. 15 is a schematic perspective view of a flat lighting apparatus according to an example embodiment of the present inventive concept.

Referring to FIG. 15, a flat panel lighting device 4100 may include a light source module 4110, a power supply 4120, and a housing 4130. The power supply 4120 may include a light emitting diode (LED) driver.

The light source module 4110 may include a light source array, and may have a generally flat shape. A light source, forming the light source module 4110, may be a white light emitting device, according to the above-mentioned example embodiments.

The power supply 4120 may supply power to the light source module 4110. The housing 4130 may have a space receiving the light source module 4110 and the power supply 4120 therein, and may have a hexahedral shape with an open side surface. However, example embodiments of the present inventive concept are not limited thereto. The light source module 4110 may emit light to the open side surface of the housing 4130.

Unlike in the previous example embodiments, in certain embodiments, at least a portion of the combination of phosphors, employed in the white light emitting device, may be disposed on other components (for example, a light guide plate, a light diffusing plate, and a lens) of the flat lighting device 4100 besides the white light emitting device.

Figure 16:
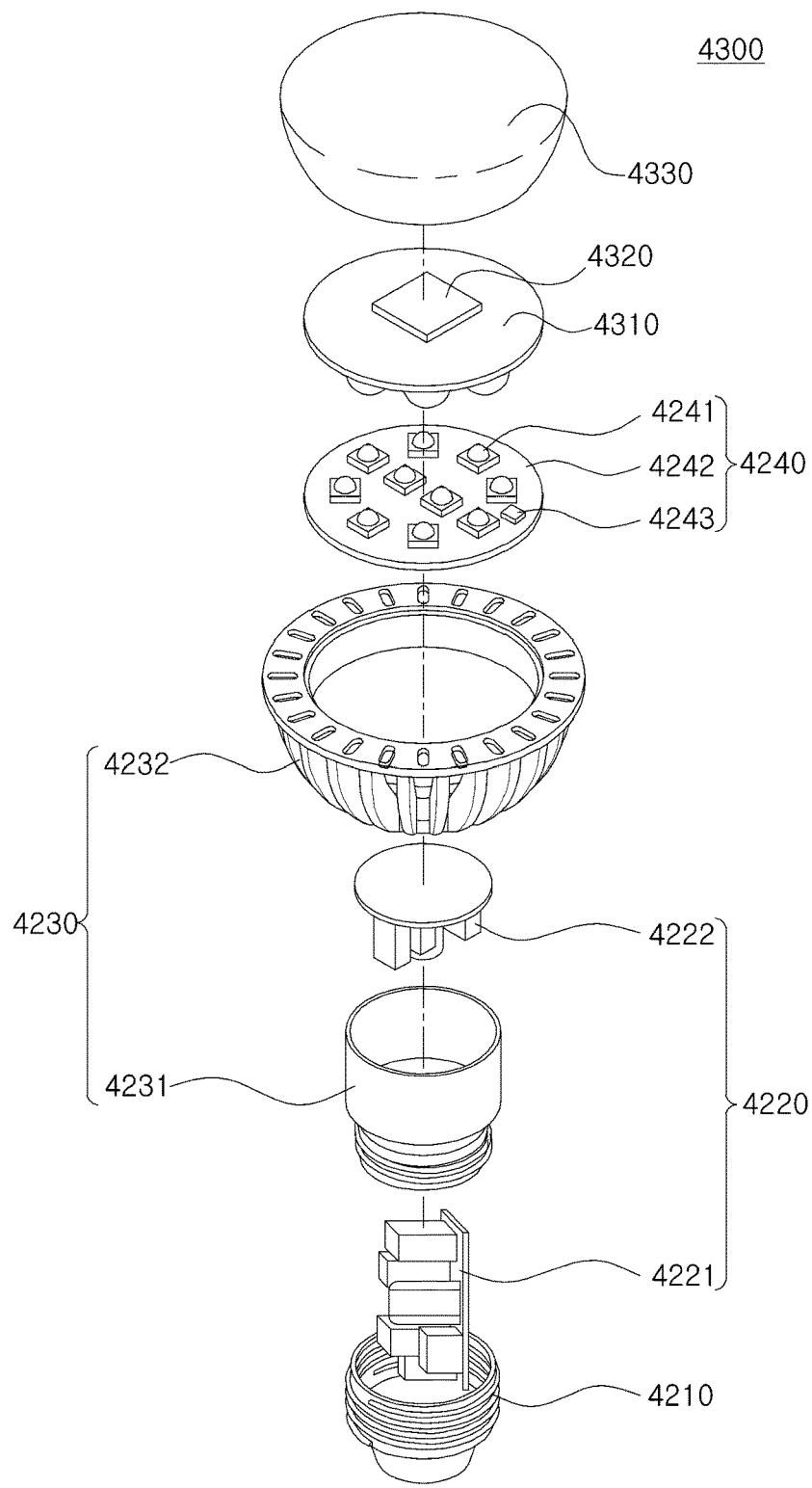
FIG. 16 is an exploded perspective view illustrating a bulb lighting device, according to an example embodiment.

FIG. 16 is an exploded perspective view illustrating a bulb lighting device, according to an example embodiment.

Referring to FIG. 16, a bulb lighting device 4300 may include a socket 4210, a power supply 4220, a heat sink 4230, a light source module 4240, and an optical unit 4330.

The socket 4210 may be compatible with that of a conventional lighting devices. For example, the socket 4210 may fit in a conventional light bulb socket. Power, supplied to the lighting device 4300, may be applied through the socket 4210. As illustrated in FIG. 16, the power supply 4220 may have a first power supply 4221 and a second power supply 4222 separated from each other. For example, the power supply 4220 may include two or more components. The heat sink 4230 may include an internal heat sink portion 4231 and an external heat sink portion 4232. The internal heat sink portion 4231 may be directly connected to the light source module 4240 and/or to the power supply 4220, to thus transfer heat to the external heat sink portion 4232. The optical unit 4330 may evenly scatter light emitted by the light source module 4240.

The light source module 4240 may receive power from the power supply 4220 to emit light to the optical unit 4330. The light source module 4240 may include at least one light source 4241, a circuit board 4242, and a controller 4243, and the controller 4243 may store operating information of the at least one light source 4241. The light source 4241 may be a white light emitting device meeting the conditions of white light, according to the above-mentioned example embodiments.

The lighting device 4300, according to the example embodiment, may include a reflector 4310 disposed in an upper portion of the light source module 4240, and the reflector 4310 may reduce glare by evenly spreading light, emitted by the at least one light source 4241, to a side surface and a rear of the reflector 4310.

A communications module 4320 may be mounted on an upper portion of the reflector 4310, and home-network communications may be provided by the communications module 4320. For example, the communication module 4320 may be a wireless communications module using Zigbee, wireless fidelity (Wi-Fi), or light fidelity (Li-Fi), and may control on/off functions and brightness of a lighting apparatus installed in and around the home through a smartphone or wireless controller. Further, use of a Li-Fi communications module using a visible light wavelength of a lighting device installed in and around residential, commercial, or industrial spaces may control electronics such as a TV, a refrigerator, an air-conditioner, a door lock, or may control a vehicle.

The reflector 4310 and the communications module 4320 may be covered by the optical unit 4330.

Figure 17:
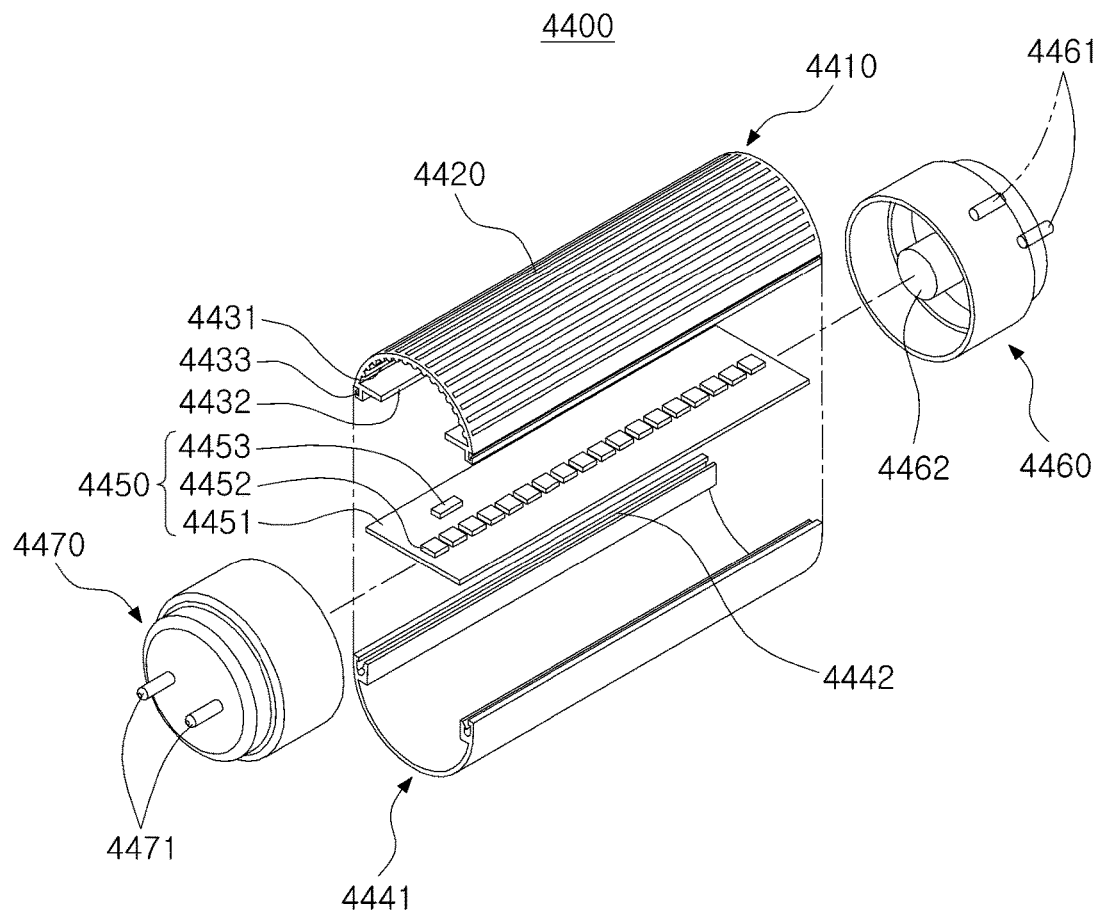
FIG. 17 is an exploded perspective view illustrating a tube lighting device, according to an example embodiment.

FIG. 17 is an exploded perspective view illustrating a tube lighting device, according to an example embodiment.

Referring to FIG. 17, the tube lighting device 4400 may have protrusions 4433 formed on opposite ends of a heat sink member 4410. The tube lighting device 4400 may include a cover 4441, a light source module 4450, a first socket 4460, and a second socket 4470.

A plurality of heat sink fins 4420 and 4431 may be formed to have an uneven pattern on an internal and/or external surface of the heat sink member 4410, and may be designed to have various shapes and intervals therebetween. The heat sink member 4410 may have protruding supports 4432 formed on an inside thereof. The light source module 4450 may be fixed to the protruding supports 4432. Protrusions 4433 may be formed on opposite sides of the heat sink member 4410.

The cover 4441 may have grooves 4442 formed therein, and the protrusions 4433 of the heat sink member 4410 may be coupled to the grooves 4442 by a hook coupling structure. Locations of the grooves 4442 and the protrusions 4433 may be switched with each other.

The light source module 4450 may include a printed circuit board 4451, a light source 4452, and a controller 4453. The controller 4453 may store driving information of the light source 4452. Circuit wirings for operating the light source 4452 may be formed in the printed circuit board 4451. In addition, the light source module 4450 may include components for operating the light source 4452. The light source 4452 may be a white light emitting device meeting the conditions of white light according to the above-mentioned example embodiments.

The first and second sockets 4460 and 4470, as a pair of sockets, may be coupled to opposite ends of a cylindrical cover unit including the heat sink member 4410 and the cover 4441. For example, the first socket 4460 may include an electrode terminal 4461 and a power device 4462, and the second socket 4470 may include a dummy terminal 4471 disposed thereon. In certain embodiments, an optical sensor and/or a communications module may be built in either of the first socket 4460 or the second socket 4470. In certain embodiments, an optical sensor and/or a communications module may be built in either of the first socket 4460 or the second socket 4470. As another example, an optical sensor and/or a communications module may be built in the first socket 4460 having the electrode terminal 4461 disposed thereon.

As set forth above, according to example embodiments of the present inventive concept, human-friendly lighting devices having a high color rendering index (CRI) of, for example, 90 or more, while effectively reducing blue light hazard (BLH), may be provided using two types of blue light sources, instead of a near-ultraviolet light source. For example, a second blue light source emitting relatively soft-blue light (for example, light having a wavelength of 465 nm to 495 nm), may contribute to increasing work efficiency and optimizing biorhythms through suppressing melatonin, as well as strengthening a CRI of white light (for example, light having a wavelength of 445 nm to 455 nm) emitted by a first blue light source. Further, there may be provided white light having a spectrum in which BLH and retinal damage may be significantly reduced through adjusting an intensity ratio of light emitted by the two light sources. Further, white light emitting devices, according to the example embodiments, may be implemented as a single module (for example, two types of blue LED chips plus a wavelength conversion member) to be used as a human-friendly functional lighting device.

While exemplary embodiments have been shown and described above, it will be apparent to those skilled in the art that modifications and variations could be made without departing from the scope of the present inventive concept, as defined by the appended claims.

What is claimed is:

1. A white light emitting device comprising:
   a substrate;
   a first light emitting diode disposed on the substrate, the first light emitting diode configured to emit first blue light having a peak intensity at a wavelength within the range of 445 nm to 455 nm;
   a second light emitting diode disposed on the substrate, the second light emitting diode configured to emit second blue light having a peak intensity at a wavelength within the range of 465 nm to 495 nm; and
   a wavelength conversion unit applied to the first light emitting diode and the second light emitting diode, the wavelength conversion unit configured to convert portions of the first blue light and the second blue light and to provide a white light formed by the combination of the converted portions of the first blue light and the second blue light with unconverted portions of the first blue light and the second blue light,
   wherein the wavelength conversion unit includes a first wavelength conversion material configured to emit first light having a peak intensity at a wavelength within the range of 520 nm to 560 nm and a second wavelength conversion material configured to emit second light having a peak intensity at a wavelength within the range of 600 nm to 645 nm, and
   wherein in a spectrum of the white light, a peak intensity of the unconverted portion of the second blue light is equal to 50% or more of a peak intensity of the unconverted portion of the first blue light, and the maximum intensity in a wavelength band of 520 nm to 560 nm is between 50% and 160% of the peak intensity of the unconverted portion of the second blue light.

2. The white light emitting device of claim 1, wherein a color rendering index (CRI) of the white light is 90 or more.

3. The white light emitting device of claim 1, wherein the peak intensity of the unconverted portion of the second blue light is higher than the peak intensity of the unconverted portion of the first blue light.

4. The white light emitting device of claim 1, wherein a blue light hazard (BLH) index of the white light at 100 lux is lower than a BLH index of white light without the second light emitting diode at 100 lux.

5. The white light emitting device of claim 1, wherein a correlated color temperature (CCT) of the white light ranges from 3,000 K to 6,700 K.

6. The white light emitting device of claim 1, wherein the first wavelength conversion material includes at least one phosphor selected from among $Ga—Y_3Al_5O_{12}$, $Al_5Lu_3O_{12}$, $Y_3Al_5O_{12}$, and $Al_5Lu_3O_{12}$.

7. The white light emitting device of claim 1, wherein the second wavelength conversion material includes a plurality of red phosphors configured to emit light having peak intensities at different wavelengths.

8. The white light emitting device of claim 7, wherein the second wavelength conversion material includes a first red phosphor configured to emit first red light having a peak intensity at a wavelength within the range of 600 nm to 630 nm, and a second red phosphor configured to emit second red light having a peak intensity at a wavelength within the range of 630 nm to 645 nm.

9. The white light emitting device of claim 1, wherein the second wavelength conversion material includes a red phosphor configured to emit red light having a peak intensity at a wavelength within the range of 625 nm to 635 nm.

10. The white light emitting device of claim 1, wherein the second wavelength conversion material includes a red phosphor selected from among $(Sr,Ca)AlSiN_3:Eu$, $CaAlSiN_3:Eu$, $K_xSiF_y:Mn^{4+}$ ($2 \leq x \leq 3$, $4 \leq y \leq 7$), and any combination thereof.

11. The white light emitting device of claim 1, wherein an excitation efficiency obtained by the first blue light is higher than an excitation efficiency obtained by the second blue light in at least one of the first wavelength conversion material and the second wavelength conversion material.

12. The white light emitting device of claim 1, wherein the wavelength conversion unit surrounds the first light emitting diode and the second light emitting diode.

13. The white light emitting device of claim 1,
    wherein the first light emitting diode is embodied in a first semiconductor chip and the second light emitting diode is embodied in a second semiconductor chip,
    wherein the area occupied by the second semiconductor chip as viewed in a top down view is greater than the area occupied by the first semiconductor chip as viewed in the top down view.

14. A white light emitting device comprising:
    a first light emitting diode configured to emit first blue light having a peak intensity at a wavelength within the range of 445 nm to 455 nm;

a second light emitting diode configured to emit second blue light having a peak intensity at a wavelength within the range of 465 nm to 490 nm;

a first wavelength conversion material configured to convert at least portions of the first blue light and the second blue light to emit first light having a peak intensity at a wavelength within the range of 520 nm to 560 nm; and a second wavelength conversion material configured to convert at least portions of the first blue light and the second blue light to emit second light having a peak intensity at a wavelength within the range of 600 nm to 645 nm, the second wavelength conversion material having at least one red phosphor selected from among $(Sr,Ca)AlSiN_3$:Eu, $CaAlSiN_3$:Eu, and any combination thereof, wherein a combination of an unconverted portion of the first blue light, an unconverted portion of the second blue light, the first light, and the second light produces a white light, and wherein, in a spectrum of the white light, peak intensities of the unconverted portion of the first blue light and the unconverted portion of the second blue light range from 50% to 110% and from 53% to 110% of a peak intensity of the second light respectively, the sum of the peak intensities of the unconverted portions of the first blue light and the second blue light ranges from 140% to 180% of the peak intensity of the second light, and the maximum intensity in a wavelength range of 530 nm to 550 nm ranges from 70% to 90% of the peak intensity of the second light.

15. The white light emitting device of claim 14, wherein, in the spectrum of the white light, the peak intensities of the unconverted portion of the first blue light and the unconverted portion of the second blue light range from 70% to 75% and from 85% to 110% of the peak intensity of the second light respectively, and the sum of the peak intensities of the unconverted portions of the first blue light and the second blue light ranges from 160% to 180% of the peak intensity of the second light.

16. The white light emitting device of claim 14, wherein, in the spectrum of the white light, the maximum intensity in a wavelength band of 540 nm to 560 nm is 72% to 88% of the peak intensity of the unconverted portion of the second blue light.

17. The white light emitting device of claim 14, wherein, when a CCT of the white light ranges from 3,750 K to 4,250 K, a BLH index of the white light is within a range of 3.6 $\mu W/cm^2$ to 5.6 $\mu W/cm^2$ per 100 lux of white light.

18. A white light emitting device comprising:

a first light emitting diode configured to emit first blue light having a peak intensity at a wavelength within the range of 445 nm to 455 nm;

a second light emitting diode configured to emit second blue light having a peak intensity at a wavelength within the range of 465 nm to 495 nm;

a first wavelength conversion material configured to convert at least portions of the first blue light and the second blue light to emit first light having a peak intensity at a wavelength within the range of 520 nm to 560 nm; and a second wavelength conversion material configured to convert at least portions of the first blue light and the second blue light to emit second light having a peak intensity at a wavelength within the range of 600 nm to 645 nm, the second wavelength conversion material including a $K_xSiF_y$:$Mn^{4+}$ ($2 \leq x \leq 3$, $4 \leq y \leq 7$) phosphor, wherein a combination of an unconverted portion of the first blue light, an unconverted portion of the second blue light, the first light, and the second light produces a white light, and wherein, in a spectrum of the white light, peak intensities of the unconverted portion of the first blue light and the unconverted portion of the second blue light range from 20% to 50% of a peak intensity of the second light, the sum of the peak intensities of the unconverted portion of the first blue light and the second blue light ranges from 58% to 67% of the peak intensity of the second light, and intensities of light having wavelengths of 530 nm and 550 nm range from 30% to 40% of the peak intensity of the second light.

19. The white light emitting device of claim 18, wherein, in the spectrum of the white light, the peak intensities of the unconverted portion of the first blue light and the unconverted portion of the second blue light range from 20% to 35% and from 30% to 50% of the peak intensity of the second light respectively, and the intensities of light having wavelengths of 530 nm and 550 nm range from 33% to 38% and from 36% to 40% of the peak intensity of the second light respectively.

20. The white light emitting device of claim 18, wherein, when a CCT of the white light ranges from 3,750 K to 4,250 K, a BLH index of the white light is within a range of 3.2 $\mu W/cm^2$ to 5.1 $\mu W/cm^2$ per 100 lux of white light.

* * * * *